US012701690B2

(12) United States Patent
Kim et al.

(10) Patent No.: US 12,701,690 B2
(45) Date of Patent: Aug. 4, 2026

(54) SEMICONDUCTOR DEVICE AND METHOD FOR FABRICATING THE SAME

(71) Applicant: SK hynix Inc., Gyeonggi-do (KR)

(72) Inventors: Seung Hwan Kim, Gyeonggi-do (KR); Gil Seop Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 488 days.

(21) Appl. No.: 18/350,754

(22) Filed: Jul. 12, 2023

(65) Prior Publication Data
US 2024/0224495 A1      Jul. 4, 2024

(30) Foreign Application Priority Data

Dec. 30, 2022    (KR) ........................ 10-2022-0190634

(51) Int. Cl.
*H10B 12/00*        (2023.01)
*H10D 30/01*        (2025.01)
*H10D 64/01*        (2025.01)

(52) U.S. Cl.
CPC ........... *H10B 12/05* (2023.02); *H10B 12/482* (2023.02); *H10D 30/023* (2025.01); *H10D 64/01* (2025.01)

(58) Field of Classification Search
CPC ...... H10B 12/05; H10B 12/482; H10D 64/01; H10D 30/023
See application file for complete search history.

(56) References Cited

U.S. PATENT DOCUMENTS

| | | | |
|---|---|---|---|
| 12,495,542 B2 * | 12/2025 | Oh ......................... | H10B 12/05 |
| 2016/0111513 A1 | 4/2016 | Liu et al. | |
| 2023/0253242 A1 * | 8/2023 | Kim .................... | H10W 10/021 |
| | | | 438/210 |

FOREIGN PATENT DOCUMENTS

| | | | |
|---|---|---|---|
| KR | 10-2022-0003270 A | 1/2022 | |
| KR | 10-2022-0166604 A | 12/2022 | |

OTHER PUBLICATIONS

Office Action for Korean Patent Application No. 10-2022-0190634 issued by the Korean Patent Office on May 26, 2026.

* cited by examiner

*Primary Examiner* — Richard A Booth
(74) *Attorney, Agent, or Firm* — IP & T GROUP LLP

(57)        ABSTRACT
A semiconductor device including highly integrated memory cells and a method for fabricating the same in which the method includes: forming a semiconductor layer pattern over a lower structure; forming a gate dielectric layer covering the semiconductor layer pattern; forming a conductive layer surrounding the semiconductor layer pattern over the gate dielectric layer; forming a pair of horizontal conductive layer patterns respectively disposed over an upper surface and a lower surface of the semiconductor layer pattern by selectively etching the conductive layer; forming a horizontal layer having a side portion between the pair of horizontal conductive layer patterns by selectively recessing the semiconductor layer pattern; and forming a pair of horizontal conductive lines respectively disposed over an upper surface and a lower surface of the horizontal layer by recessing the pair of horizontal conductive layer patterns.

15 Claims, 20 Drawing Sheets

SEMICONDUCTOR DEVICE AND METHOD FOR FABRICATING THE SAME

CROSS-REFERENCE TO RELATED APPLICATION

This application claims priority under 35 U.S.C. § 119 to Korean Patent Application No. 10-2022-0190634 filed on Dec. 30, 2022, which is incorporated herein by reference in its entirety.

BACKGROUND

1. Field

Embodiments of the present disclosure relate to a semiconductor device, and more particularly, to a semiconductor device including a three-dimensional (3D) memory cell and a method for fabricating the same.

2. Discussion of the Related Art

Recently, in order to cope with an increase in capacity and miniaturization of a memory device, a technology for providing a 3D memory device in which a plurality of memory cells are stacked has been advanced.

SUMMARY

Various embodiments of the present disclosure are directed to providing a semiconductor device including highly integrated memory cells and a method for fabricating the same.

A method for fabricating a semiconductor device in accordance with one embodiment of the present disclosure may include: forming a semiconductor layer pattern over a lower structure; forming a gate dielectric layer covering the semiconductor layer pattern; forming a conductive layer surrounding the semiconductor layer pattern over the gate dielectric layer; forming a pair of horizontal conductive layer patterns respectively disposed over an upper surface and a lower surface of the semiconductor layer pattern by selectively etching the conductive layer; forming a horizontal layer having a side portion between the pair of horizontal conductive layer patterns by selectively recessing the semiconductor layer pattern; and forming a pair of horizontal conductive lines respectively disposed over an upper surface and a lower surface of the horizontal layer by recessing the pair of horizontal conductive layer patterns.

A semiconductor device in accordance with another embodiment of the present disclosure may include: a bit line vertically oriented along a first direction over a lower structure; a semiconductor layer pattern horizontally oriented along a second direction from the bit line; a gate dielectric layer fully-covering an upper surface and a lower surface of the semiconductor layer pattern; and a word line horizontally oriented along a third direction intersecting the semiconductor layer pattern over the gate dielectric layer. The semiconductor device further comprising: a data storage element coupled to the other side of the semiconductor layer pattern, wherein the upper surface and the lower surface of the semiconductor layer pattern each include a flat surface, and one side of the gate dielectric layer contacts the bit line, and the other side of the gate dielectric layer contacts the data storage element. The semiconductor layer pattern includes a single crystal silicon layer. The word line includes polysilicon, metal, metal nitride, or a combination thereof.

The word line includes double word lines facing each other with the semiconductor layer pattern interposed between the double word lines. The word line includes a first low work function material, a second low work function material, and a high work function material between the first low work function material and the second low work function material, and the first low work function material, the high work function material, and the second low work function material are horizontally disposed along a direction parallel to a surface of the semiconductor layer pattern. The gate dielectric layer includes silicon oxide covering the upper surface and the lower surface of the semiconductor layer pattern. The semiconductor layer pattern comprises: a first doped region; a second doped region; and a channel disposed between the first doped region and the second doped region and vertically overlapping the word line. The channel comprises: a first underlap region between the first doped region and the word line; and a second underlap region between the second doped region and the word line.

A semiconductor device in accordance with yet another embodiment of the present disclosure may include: a horizontal layer spaced apart from a lower structure and extending along a direction parallel to the lower structure; a vertical conductive line extending along a direction perpendicular to the lower structure and coupled to one end of the horizontal layer; a data storage element coupled to the other end of the horizontal layer; and a horizontal conductive line extending along a direction crossing the horizontal layer, wherein the horizontal conductive line may include: a first work function electrode; a second work function electrode adjacent to the vertical conductive line and having a lower work function than the first work function electrode; a third work function electrode adjacent to the data storage element and having a lower work function than the first work function electrode; a first barrier layer between the first work function electrode and the third work function electrode; and a second barrier layer between the first work function electrode and the second work function electrode.

A semiconductor device in accordance with still another embodiment of the present disclosure may include: a semiconductor layer spaced apart from a lower structure and extending along a direction parallel to the lower structure; a vertical conductive line extending along a direction perpendicular to the lower structure and coupled to one end of the semiconductor layer; a data storage element coupled to the other end of the semiconductor layer; and a word line extending along a direction crossing the semiconductor layer, wherein the word line may include: a metal electrode; a first polysilicon electrode adjacent to the vertical conductive line and having a lower work function than the metal electrode; and a second polysilicon electrode adjacent to the data storage element and having a lower work function than the metal electrode.

A semiconductor device in accordance with a different embodiment of the present disclosure may include: a lower structure; a three-dimensional array including a column array of vertically stacked transistors over the lower structure; a vertical conductive line vertically oriented over the lower structure and commonly coupled to one sides of individual transistors of the three-dimensional array; and a data storage element coupled to the other sides of the individual transistors of the three-dimensional array, wherein the individual transistors of the column array of the three-dimensional array may each include: a horizontal layer; and a horizontal conductive line having a triple work function electrode structure extending horizontally along a direction crossing the horizontal layer. The horizontal conductive line having the triple work function electrode structure may include a first low work function electrode, a second low work function electrode, and a high work function electrode between the first low work function electrode and the second low work function electrode.

The present technology in one aspect can reduce gate induced drain leakage (GIDL) by forming a word line of a triple work function electrode.

The present technology in another aspect can reduce leakage current by forming a word line of a triple work function electrode, and secure refresh characteristics, thereby achieving low power consumption by consuming a low amount of power.

The present technology in still another aspect uses a first recess process, a cutting process, and a second recess process in order to form a horizontal conductive line, so that it is possible to secure uniformity in length of the horizontal conductive lines in a lateral direction by reducing the recess amount of sides of a conductive layer. In this way, the uniformity of the horizontal conductive lines is secured, so that it is possible to improve gate induced drain leakage (GIDL) distribution and capacitance distribution.

DETAILED DESCRIPTION

Figure 1A:
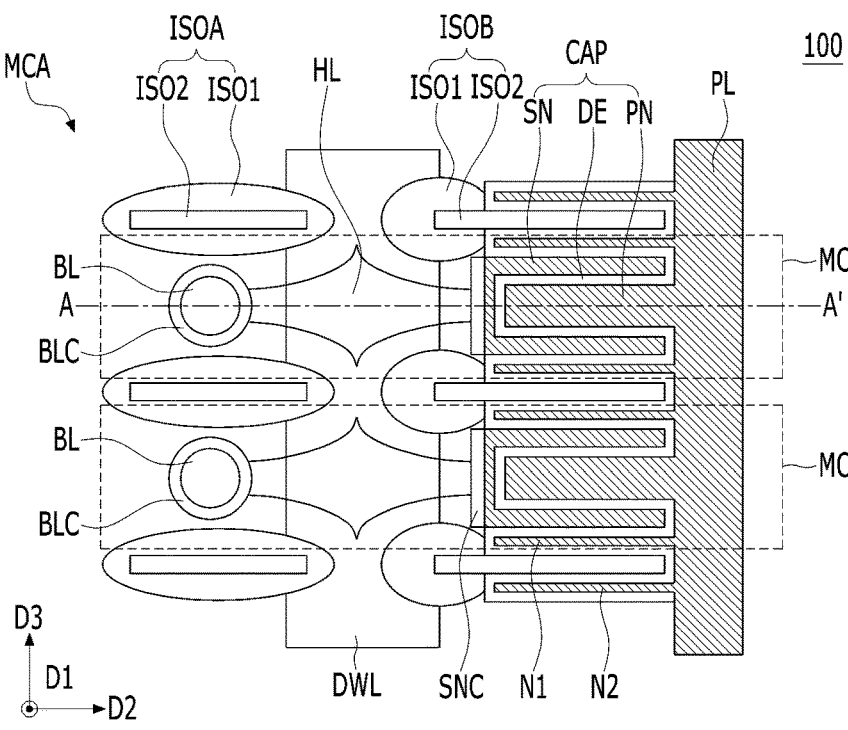
FIG. 1A is a schematic plan view of a semiconductor device in accordance with one embodiment.

Embodiments described herein will be described with reference to cross-sectional views, plan views, and block diagrams, which are ideal schematic diagrams of the present disclosure. Accordingly, the shapes of the illustrative drawings may be modified due to manufacturing techniques and/or tolerances. Accordingly, embodiments of the present disclosure are not limited to the illustrated specific shapes, and also include changes in shapes generated according to fabrication processes. Accordingly, regions illustrated in the drawings have schematic attributes, and the shapes of the regions illustrated in the drawings are intended to illustrate a specific shape of a region of a device and are not intended to limit the scope of the disclosure.

Embodiments to be described below in one aspect can increase memory cell density and reduce parasitic capacitance by vertically stacking memory cells.

Embodiments to be described below relate to a three-dimensional memory cell, and a horizontal conductive line (word line or gate electrode) may include a low work function electrode and a high work function electrode. The low work function electrode may be adjacent to a data storage element (for example, capacitor) and a vertical conductive line (or bit line), and the high work function electrode may overlap a channel of a horizontal layer.

In one embodiment, a low electric field can be formed between the horizontal conductive line and the data storage element due to a low work function of the low work function electrode, thereby making it possible to reduce leakage current.

In another embodiment, a high threshold voltage of the switching element can formed due to a high work function of the high work function electrode, and the height of a memory cell can be lowered due to formation of a low electric field, which is advantageous in terms of integration density improvement.

Figure 1B:
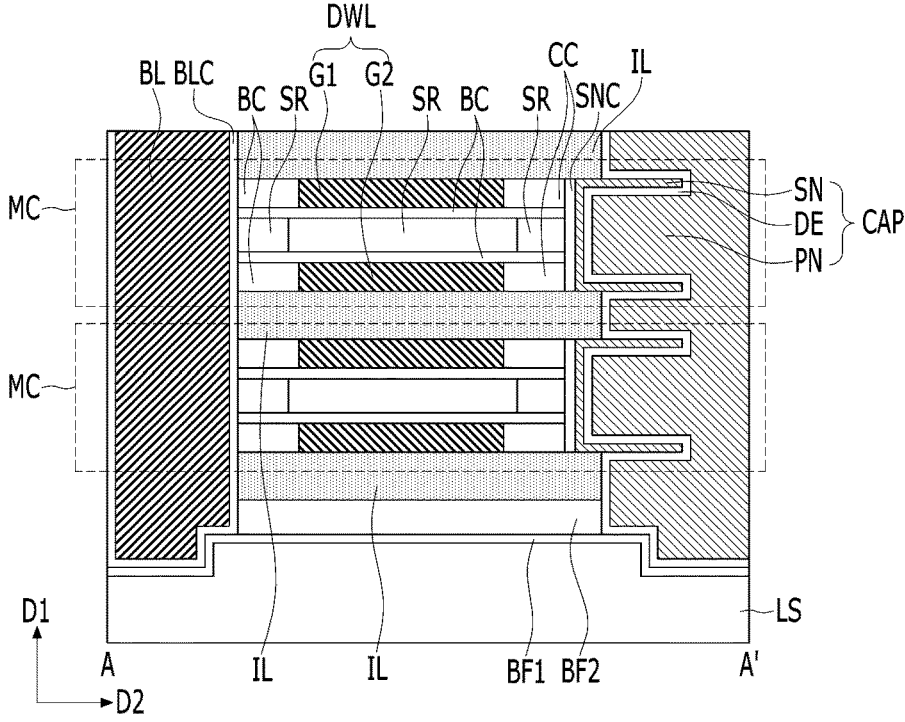
FIG. 1B is a schematic cross-sectional view taken along A-A' in FIG. 1A.

FIG. 1A is a schematic plan view of a semiconductor device 100 in accordance with one embodiment. FIG. 1B is a schematic cross-sectional view taken along A-A' in FIG. 1A.

Referring to FIG. 1A and FIG. 1B, the semiconductor device 100 may include a memory cell array (MCA). The memory cell array MCA may include a plurality of memory cells MC. The memory cell array MCA may include a three-dimensional array of the memory cells MC. The three-dimensional array of the memory cells MC may include a column array of the memory cells MC and a row array of the memory cells MC. The column array of the memory cells MC may include a plurality of memory cells MC stacked along a first direction D1, and the row array of the memory cells MC may include a plurality of memory cells MC horizontally disposed along a second direction D2 and a third direction D3. In some embodiments, cell insulating layers IL may be disposed between the memory cells MC stacked along the first direction D1. Isolation layers ISOA and ISOB may be disposed between memory cells MC adjacent along the third direction D3. The isolation layers ISOA and ISOB may each include a first isolation material ISO1 and a second isolation material ISO2. The first isolation material ISO1 may include silicon oxide, and the second isolation material ISO2 may include silicon carbon oxide (SiCO).

The memory cell array MCA may be disposed above a lower structure LS.

The individual memory cell MC may include a vertical conductive line BL, a switching element TR, and a data storage element CAP. The isolation layers ISOA and ISOB may include a first isolation layer ISOA and a second isolation layer ISOB. The first isolation layer ISOA may be disposed between the vertical conductive lines BL along the third direction D3. The second isolation layer ISOB may be disposed between the data storage elements CAP along the third direction D3.

Figure 2:
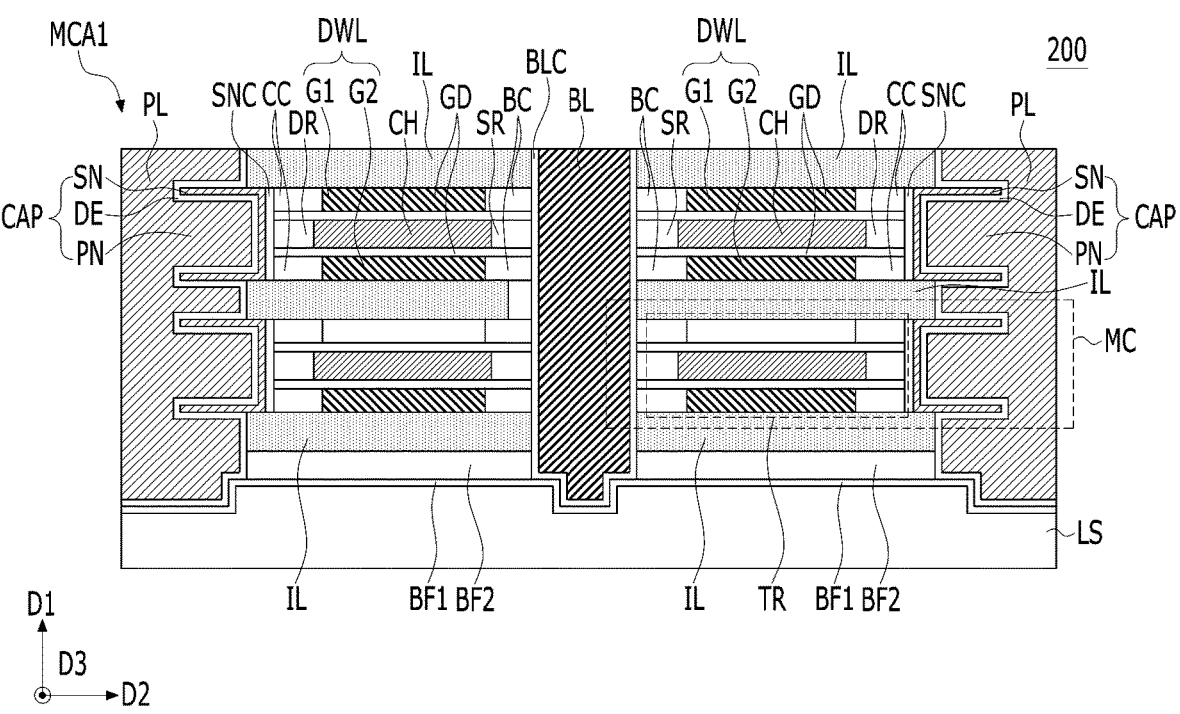
FIG. 2 is a schematic cross-sectional view of a semiconductor device in accordance with another embodiment.

The switching element TR (as shown in FIG. 2) may include a horizontal layer HL, a gate dielectric layer GD, and a horizontal conductive line DWL. The data storage element CAP may include a memory element such as a capacitor. The vertical conductive line BL may include a bit line. The horizontal conductive line DWL may include a word line, and the horizontal layer HL may include an active layer. The data storage element CAP may include a first electrode SN, a dielectric layer DE, and a second electrode PN. The switching element TR may include a transistor, and in such a case, the horizontal conductive line DWL may serve as a gate electrode. The switching element TR may also be referred to as an access element or a select element.

The memory cell array MCA may include a plurality of horizontal conductive lines DWL vertically stacked along the first direction D1. The memory cell array MCA may include a plurality of horizontal layers HL vertically stacked along the first direction D1. The memory cell array MCA may include a plurality of data storage elements CAP vertically stacked along the first direction D1.

As shown in FIG. 1B, a plurality of buffer layers BF1 and BF2 may be disposed between the lowermost horizontal conductive line DWL among the plurality of horizontal conductive lines DWL and the lower structure LS. The buffer layers BF1 and BF2 may each include an insulating material. The buffer layers BF1 and BF2 may include a first buffer layer BF1 and a second buffer layer BF2. The first and second buffer layers BF1 and BF2 may each include silicon oxide. The first buffer layer BF1 out of the buffer layers BF1 and BF2 may cover the entire surface of the lower structure LS, and thus the vertical conductive line BL and the data storage elements CAP may be electrically isolated from the lower structure LS.

The vertical conductive line BL may extend vertically from above the lower structure LS along the first direction D1. The horizontal layer HL may extend along the second direction D2 intersecting the first direction D1. The horizontal conductive line DWL may extend along the third direction D3 intersecting the first direction D1 and the second direction D2. The first direction D1 may be a vertical direction, the second direction D2 may be a first horizontal direction, and the third direction D3 may be a second horizontal direction.

The vertical conductive line BL may be vertically oriented along the first direction D1. The vertical conductive line BL may be referred to as a vertically-oriented bit line, a vertically-extended bit line, or a pillar-shaped bit line. The vertical conductive line BL may include a conductive material. The vertical conductive line BL may include a silicon-base material, a metal-base material, or a combination thereof. The vertical conductive line BL may include polysilicon, metal, metal nitride, metal silicide, or a combination thereof. The vertical conductive line BL may include, for example, polysilicon, titanium nitride, tungsten, or a combination thereof. In one example, the vertical conductive line BL may include polysilicon or titanium nitride (TIN) doped with N-type impurities. The vertical conductive line BL may include a stack (TiN/W) of titanium nitride and tungsten. Vertical conductive lines BL of the memory cells MC adjacent along the third direction D3 may be isolated from each other by the first isolation layer ISOA.

The switching element TR may include a transistor, and thus, the horizontal conductive line DWL may be referred to as a horizontal gate line or a horizontal word line.

The horizontal conductive line DWL may be elongated along the third direction D3, and the horizontal layer HL may extend along the second direction D2. The horizontal layer HL may be horizontally arranged from and adjacent to the vertical conductive line BL. The horizontal conductive line DWL may have a double structure. For example, the horizontal conductive line DWL may include first and second horizontal conductive lines WL1 and WL2 facing each other with the horizontal layer HL interposed therebetween. A gate dielectric layer GD may be formed on an upper surface and a lower surface of the horizontal layer HL. The first horizontal conductive line WL1 may be disposed above the horizontal layer HL, and the second horizontal conductive line WL2 may be disposed below the horizontal layer HL. The horizontal conductive line DWL may include a pair of the first horizontal conductive line WL1 and the second horizontal conductive line WL2. In the horizontal conductive line DWL, the first horizontal conductive line WL1 and the second horizontal conductive line WL2 may have substantially the same potential. For example, the first horizontal conductive line WL1 and the second horizontal conductive line WL2 may be paired with each other and be coupled to one memory cell MC. Substantially the same driving voltage may be applied to the first horizontal conductive line WL1 and the second horizontal conductive line WL2.

The horizontal layer HL may extend along the second direction D2. The horizontal layer HL may include a semiconductor material. For example, the horizontal layer HL may include polysilicon, single crystal silicon, germanium, or silicon-germanium. In another embodiment, the horizontal layer HL may include an oxide semiconductor material. Examples of the oxide semiconductor material may include indium gallium zinc oxide (IGZO).

The upper surface and the lower surface of the horizontal layer HL may each have a flat surface. That is, the upper surface and the lower surface of the horizontal layer HL may be parallel to each other along the second direction D2.

As shown in FIG. 2, the horizontal layer HL may include a channel CH, a first doped region SR between the channel CH and the vertical conductive line BL, and a second doped region DR between the channel CH and the data storage element CAP. When the horizontal layer HL is an oxide semiconductor material, the channel CH may be made of an oxide semiconductor material, and the first and second doped regions SR and DR may be omitted. The horizontal layer HL may also be referred to as an active layer or a thin-body.

The first doped region SR and the second doped region DR may be doped with substantially the same conductivity type of impurities. The first doped region SR and the second doped region DR may be doped with N-type impurities or P-type impurities. The first doped region SR and the second doped region DR may each include at least one impurity selected from arsenic (As), phosphorus (P), boron (B), indium (In), and a combination thereof. The first doped region SR may be coupled to the vertical conductive line BL, and the second doped region DR may be coupled to the first electrode SN of the data storage element CAP.

The gate dielectric layer GD may include for example silicon oxide, silicon nitride, metal oxide, metal oxynitride, metal silicate, high-k material, ferroelectric material, anti-ferroelectric material, or a combination thereof. The gate dielectric layer GD may include for example $SiO_2$, $Si_3N_4$, $HfO_2$, $Al_2O_3$, $ZrO_2$, AlON, HfON, HfSiO, HfSiON, or a combination thereof.

The gate dielectric layer GD may have a shape that fully (or substantially) covers a first surface (or upper surface) and a second surface (or lower surface) of the horizontal layer HL. The present invention may also have a gate dielectric layer GD with a shape that only partially covers a first surface (or upper surface) and a second surface (or lower surface) of the horizontal layer HL, provided that the gate electrode does not electrically short to the horizontal layer HL containing the channel CH. A length of the gate dielectric layer GD along the second direction D2 may be substantially the same as that of the horizontal layer HL. The first surface and the second surface of the horizontal layer HL may be flat surfaces.

The horizontal conductive line DWL may include metal, a metal mixture, a metal alloy, or a semiconductor material. The horizontal conductive line DWL may include titanium nitride, tungsten, polysilicon, or a combination thereof. In one example, the horizontal conductive line DWL may include a TiN/W stack in which titanium nitride and tungsten are sequentially stacked. The horizontal conductive line DWL may include an N-type work function material or a P-type work function material. The N-type work function material may have a low work function of 4.5 eV or less, and the P-type work function material may have a high work function of 4.5 eV or more.

The data storage element CAP may be horizontally disposed along the second direction D2 from the switching element TR. The data storage element CAP may include the first electrode SN extending horizontally from the horizontal layer HL along the second direction D2. The data storage element CAP may further include the second electrode PN on the first electrode SN and the dielectric layer DE between the first electrode SN and the second electrode PN. The first electrode SN, the dielectric layer DE, and the second electrode PN may be horizontally arranged along the second direction D2. The first electrode SN may have a horizontally oriented cylinder shape. The dielectric layer DE may conformally cover a cylindrical inner wall and a cylindrical outer wall of the first electrode SN. The second electrode PN may cover the cylindrical inner wall and the cylindrical outer wall of the first electrode SN on the dielectric layer DE. The first electrode SN may be electrically connected to a second source/drain region DR. The second electrode PN may include a plurality of outer nodes N1 and N2 disposed on an outer wall of the first electrode SN. As shown in FIG. 1A, the outer nodes N1 and N2 of memory cells MC adjacent along the third direction D3 may be isolated from each other by the second isolation materials ISO2 of the second isolation layer ISOB.

The first electrode SN may have a three-dimensional structure, and the first electrode SN having the three-dimensional structure may have a horizontal three-dimensional structure oriented along the second direction D2. As an example of the three-dimensional structure, the first electrode SN may have a cylindrical shape. In another embodiment, the first electrode SN may have a pillar shape or a pylinder shape. The pylinder shape refers to a structure in which a pillar shape and a cylindrical shape are merged.

The first electrode SN and the second electrode PN may each include for example metal, noble metal, metal nitride, conductive metal oxide, conductive noble metal oxide, metal carbide, metal silicide, or a combination thereof. In one example, the first electrode SN and the second electrode PN may each include titanium (Ti), titanium nitride (TIN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack, or a combination thereof. The second electrode PN may include a combination of a metal-base material and a silicon-base material. For example, the second electrode PN may be a stack (TiN/SiGe/WN) of titanium nitride/silicon germanium/tungsten nitride. In the titanium nitride/silicon germanium/tungsten nitride (TIN/SiGe/WN) stack, silicon germanium may be a gap-fill material for filling the cylinder inside of the first electrode SN, titanium nitride (TIN) may serve as the second electrode PN of the data storage element CAP, and tungsten nitride may be a low-resistance material.

The dielectric layer DE may be referred to as a capacitor dielectric layer or a memory layer. The dielectric layer DE may include silicon oxide, silicon nitride, a high-k material, or a combination thereof. The high-k material may have a higher dielectric constant than silicon oxide ($SiO_2$). The silicon oxide ($SiO_2$) may have a dielectric constant of about 3.9, and the dielectric layer DE may include a high-k dielectric constant material having a dielectric constant of 4 or more. The high-k dielectric constant material may have a dielectric constant of about 20 or greater. The high-k dielectric constant material may include for example hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$), or a combination thereof. In another embodiment, the dielectric layer DE may also include a composite layer including two or more layers of the high-k dielectric constant material described above.

The dielectric layer DE may be made of zirconium-base oxide (Zr-base oxide). The dielectric layer DE may have a stack structure including zirconium oxide ($ZrO_2$). The dielectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked on zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide-base layer ($ZrO_2$-base layer).

In another embodiment, the dielectric layer DE may be made of hafnium-base oxide (Hf-base oxide). The dielectric layer DE may have a stack structure including hafnium oxide ($HfO_2$). The dielectric layer DE may include a HA ($HfO_2/Al_2O_3$) stack or a HAH ($HfO_2/Al_2O_3/HfO_2$) stack. The HA stack may have a structure in which aluminum oxide ($Al_2O_3$) is stacked on hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide-base layer ($HfO_2$-base layer). In the ZA stack, the ZAZ stack, the HA stack, and the HAH stack, aluminum oxide ($Al_2O_3$) may have higher bandgap energy than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high bandgap material having higher bandgap energy than the high-k material. The dielectric layer DE may also include silicon oxide ($SiO_2$) as another high bandgap material in addition to aluminum oxide ($Al_2O_3$). Since the dielectric layer DE includes a high bandgap material, leakage current may be suppressed in accordance with one aspect of the invention. The high bandgap material may be thinner than the high-k material. In another embodiment, the dielectric layer DE may include a laminated structure in which a high-k material and a high bandgap material are alternately stacked. For example, a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

In another embodiment, the dielectric layer DE may include a stack structure, a laminated structure, or a mutual mixing structure including zirconium oxide, hafnium oxide, and aluminum oxide.

In another embodiment, an interface control layer for reducing leakage current may be further formed between the first electrode SN and the dielectric layer DE. The interface control layer may include titanium oxide ($TiO_2$), tantalum oxide ($Ta_2O_5$), or niobium oxide ($Nb_2O_5$), or a combination thereof. The interface control layer may also be formed between the second electrode PN and the dielectric layer DE.

The data storage element CAP may include a metal-insulator-metal (MIM) capacitor. The first electrode SN and the second electrode PN may each include a metal-base material.

The data storage element CAP may also be replaced with another data storage material. For example, the data storage material may be a phase change material, a magnetic tunnel junction (MTJ), or a variable resistance material.

As shown in FIG. 1B, a first capping layer BC may be disposed between the horizontal conductive line DWL and the vertical conductive line BL. A second capping layer CC may be between the horizontal conductive line DWL and the first electrode SN of the data storage element CAP. The first capping layer BC may be disposed between the first horizontal conductive line G1 and the vertical conductive line BL, and may also be disposed between the second horizontal conductive line G2 and the vertical conductive line BL. The second capping layer CC may be disposed between the first horizontal conductive line G1 and the first electrode SN of the data storage element CAP, and may also be disposed between the second horizontal conductive line G2 and the first electrode SN of the data storage element CAP.

The first and second capping layers BC and CC may each include an insulating material. The first and second capping layers BC and CC may each include for example silicon oxide, silicon nitride, silicon carbon oxide, an air gap, or a combination thereof. The first capping layer BC may include silicon oxide, and the second capping layer CC may include a stack of silicon oxide and silicon nitride.

The memory cell MC may further include a first contact node BLC between the vertical conductive line BL and the horizontal layer HL and a second contact node SNC between the horizontal layer HL and the data storage element CAP. The first and second contact nodes BLC and SNC may each include doped polysilicon. The first doped region SR and the second doped region DR may include impurities diffused from the first and second contact nodes BLC and SNC, respectively. The first contact node BLC may surround the vertical conductive line BL. The second contact node SNC may be disposed between the cell insulating layers IL and may extend vertically along the first direction D1.

The cell insulating layers IL may be disposed between the memory cells MC stacked along the first direction D1. The isolation layers ISOA and ISOB may be disposed between memory cells MC adjacent along the third direction D3. The second electrodes PN of the data storage elements CAP adjacent along the first direction D1 and the third direction D3 may be coupled to each other.

FIG. 2 is a schematic cross-sectional view of a semiconductor device 200 in accordance with another embodiment. Hereinafter, a detailed description of overlapping components will refer to FIG. 1A and FIG. 1B.

Referring to FIG. 2, the semiconductor device 200 may include a lower structure LS and a memory cell array MCA1. The memory cell array MCA1 may include a three-dimensional array of memory cells MC. The three-dimensional array of the memory cells MC may include a column array of the memory cells MC and a row array of the memory cells MC. The column array of the memory cells MC may include a plurality of memory cells MC stacked along the first direction D1, and the row array of the memory cells MC may include a plurality of memory cells MC horizontally disposed along the third direction D3. In some embodiments, cell insulating layers may be disposed between the memory cells MC stacked along the first direction D1.

The memory cell array MCA1 may have a mirror-type structure sharing a vertical conductive line BL.

An individual memory cell MC may include a vertical conductive line BL, a switching element TR, and a data storage element CAP. An individual switching element TR is a transistor and may include a horizontal layer HL, a gate dielectric layer GD, and a horizontal conductive line DWL. An individual horizontal layer HL may include a first doped region SR, a second doped region DR, and a channel CH between the first doped region SR and the second doped region DR. An individual horizontal conductive line DWL may include a pair of a first horizontal conductive line G1 and a second horizontal conductive line G2. An individual data storage element CAP may include a first electrode SN, a second electrode PN, and a dielectric layer DE between the first electrode SN and the second electrode PN.

The column array of the memory cells MC may include a plurality of switching elements TR stacked along the first direction D1, and the row array of the memory cells MC may include a plurality of switching elements TR horizontally disposed along the third direction D3.

The horizontal layers HL may be stacked above the lower structure LS along the first direction D1, and may also be spaced apart from the lower structure LS to extend along the second direction D2 parallel to the surface of the lower structure LS.

The vertical conductive line BL may extend along the first direction D1 perpendicular to the surface of the lower structure LS, and may be coupled on one side to first ends of the horizontal layers HL.

The data storage elements CAP may be coupled on an opposite side to second ends of the horizontal layers HL, respectively.

The memory cell MC may further include a first contact node BLC between the vertical conductive line BL and the horizontal layer HL and a second contact node SNC between the horizontal layer HL and the data storage element CAP. The first and second contact nodes BLC and SNC may each include doped polysilicon. The first doped region SR and the second doped region DR may include impurities diffused from the first and second contact nodes BLC and SNC, respectively.

The horizontal conductive lines DWL may be stacked above the lower structure LS along the first direction D1, and may also be spaced apart from the lower structure LS to extend along the third direction D3 parallel to the surface of the lower structure LS.

The second electrodes PN of the data storage elements CAP may be coupled to a common plate PL. The horizontal layers HL of the switching elements TR horizontally disposed along the third direction D3 may share one horizontal conductive line DWL. The horizontal layers HL of the switching elements TR horizontally disposed along the third direction D3 may be coupled to different vertical conductive lines BL. The switching elements TR stacked along the first direction D1 may share one vertical conductive line BL. The switching elements TR horizontally disposed along the third direction D3 may share one horizontal conductive line DWL.

The lower structure LS may include a semiconductor substrate or a peripheral circuit unit. The lower structure LS may be disposed at a lower level than the memory cell array MCA1. This may be referred to as a cell over PERI (COP) structure. The peripheral circuit unit may include at least one control circuit for driving the memory cell array MCA1. The at least one control circuit of the peripheral circuit unit may include an N-channel transistor, a P-channel transistor, a CMOS circuit, or a combination thereof. The at least one control circuit of the peripheral circuit unit may include an address decoder circuit, a read circuit, a write circuit, and the like. The at least one control circuit of the peripheral circuit unit may include a planar channel transistor, a recess channel transistor, a buried gate transistor, a fin channel transistor (FinFET), and the like.

In one example, the peripheral circuit unit may include sub-word line drivers and a sense amplifier. The horizontal conductive lines DWL may be coupled to the sub-word line drivers. The vertical conductive line BL may be coupled to the sense amplifier.

In another embodiment, the peripheral circuit unit may be disposed at a higher level than the memory cell array MCA1. This may be referred to as a PERI over cell (POC) structure.

The memory cell array MCA1 may include horizontal conductive lines DWL stacked along the first direction D1. The individual horizontal conductive line DWL may include a pair of a first horizontal conductive line G1 and a second horizontal conductive line G2.

In another embodiment, the semiconductor device 200 may include a mirror-type structure sharing a common plate PL.

The memory cell array MCA1 shows a three-dimensional memory cell array including four memory cells MC.

Figure 3A:
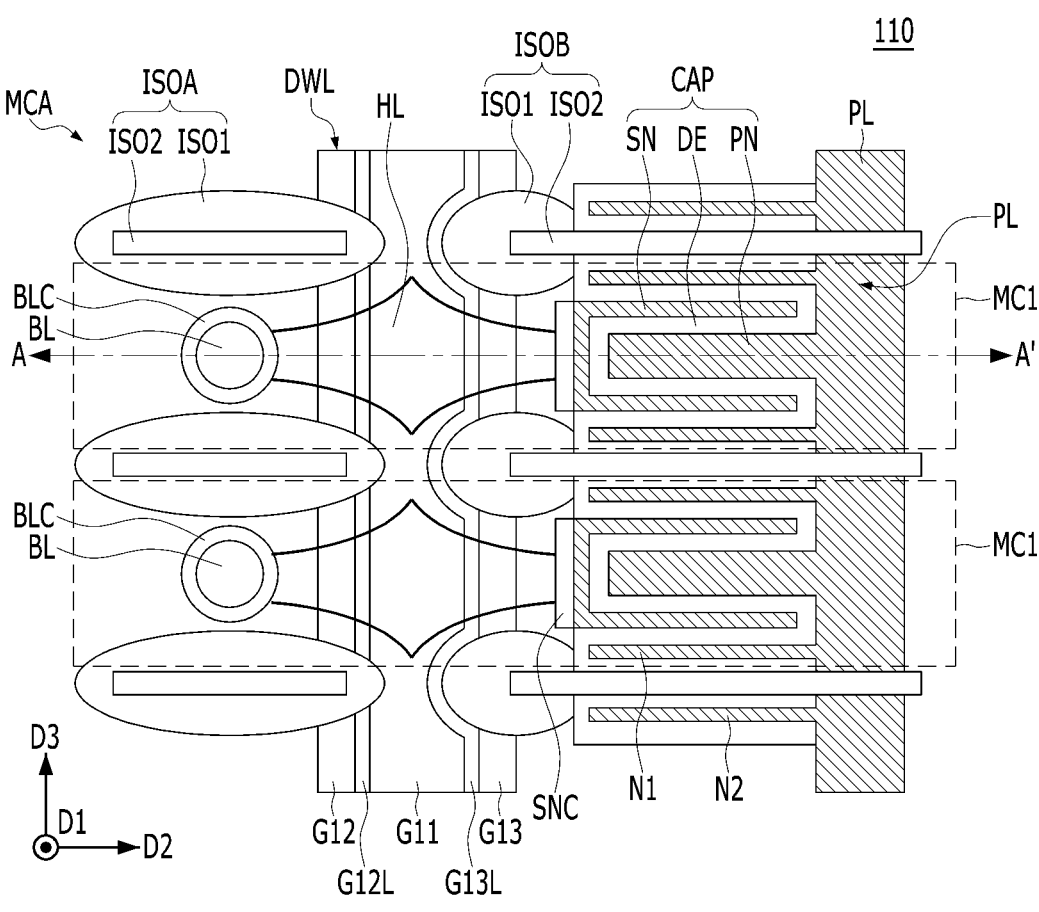
FIG. 3A is a schematic plan view of a semiconductor device in accordance with yet another embodiment.
Figure 3B:
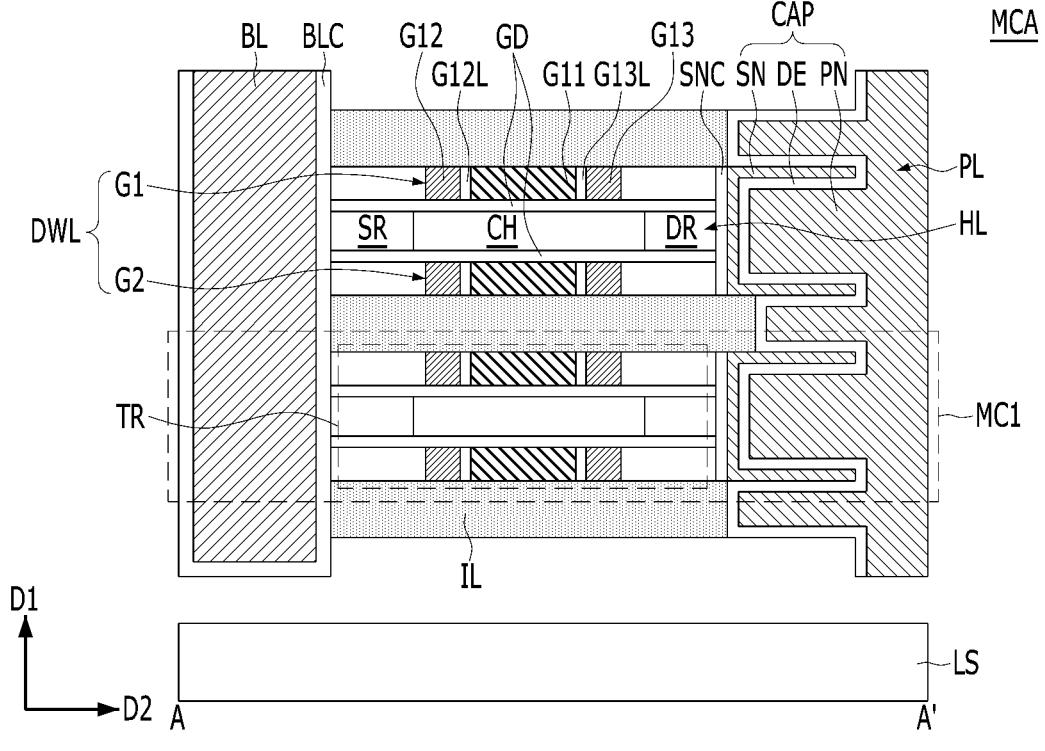
FIG. 3B is a schematic cross-sectional view of a memory cell array in FIG. 3A.
Figure 3C:
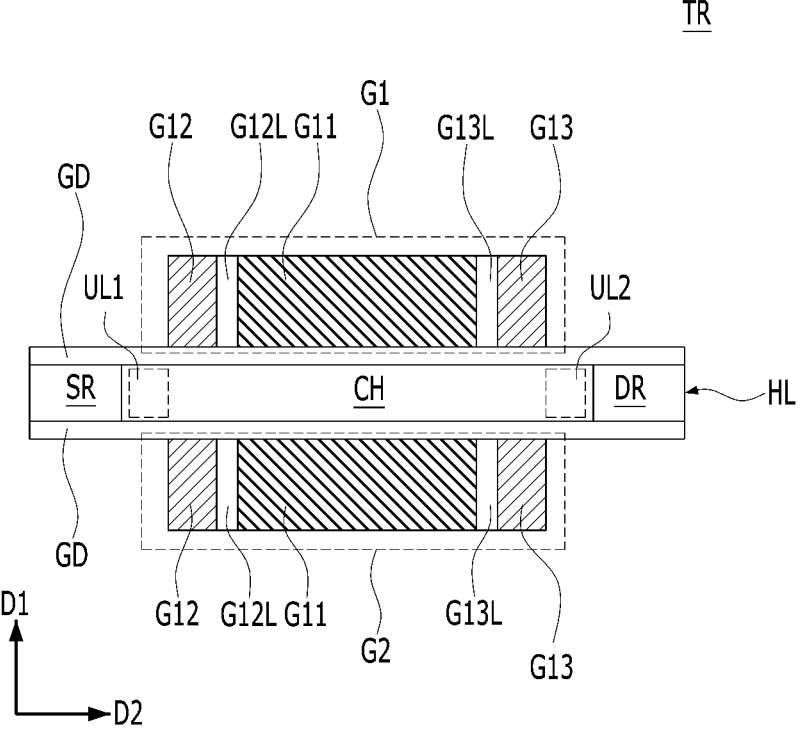
FIG. 3C is a detailed view of a switching element in FIG. 3B.

FIG. 3A is a schematic plan view of a semiconductor device 110 in accordance with another embodiment, and FIG. 3B is a schematic cross-sectional view of a memory cell array in FIG. 3A. FIG. 3C is a detailed view of a switching element TR in FIG. 3B.

Referring to FIG. 3A to FIG. 3C, the semiconductor device 110 may include a memory cell array MCA. The memory cell array MCA may include a plurality of memory cells MC1. The individual memory cell MC1 may include a vertical conductive line BL, a switching element TR, and a data storage element CAP. The switching element TR may include a horizontal layer HL, a gate dielectric layer GD, and a horizontal conductive line DWL. The horizontal layer HL may include a first doped region SR, a second doped region DR, and a channel CH. The data storage element CAP may include a first electrode SN, a second electrode PN, and a dielectric layer DE. Isolation layers ISOA and ISOB may be disposed between memory cells MC1 adjacent along the third direction D3. The isolation layers ISOA and ISOB may each include a first isolation material ISO1 and a second isolation material ISO2. The first isolation material ISO1 may include silicon oxide, and the second isolation material ISO2 may include silicon carbon oxide (SiCO).

The memory cell array MCA may be disposed above a lower structure LS.

The individual memory cell MC1 may include the vertical conductive line BL, the switching element TR, and the data storage element CAP. The isolation layers ISOA and ISOB may include a first isolation layer ISOA and a second isolation layer ISOB. The first isolation layer ISOA may be disposed between the vertical conductive lines BL along the third direction D3. The second isolation layer ISOB may be disposed between the data storage elements CAP along the third direction D3.

The memory cell MC1 may further include a first contact node BLC between the vertical conductive line BL and the horizontal layer HL and a second contact node SNC between the horizontal layer HL and the data storage element CAP. The first and second contact nodes BLC and SNC may each include doped polysilicon. The first doped region SR and the second doped region DR may include impurities diffused from the first and second contact nodes BLC and SNC, respectively.

The second electrodes PN of the data storage elements CAP of the memory cells MC1 adjacent along the third direction D3 may be isolated from each other. For example, the second electrodes PN adjacent along the third direction D3 may be isolated from each other by the second isolation material ISO2. The second electrodes PN of memory cells MC1 adjacent along the third direction D3 may be completely isolated by the second isolation material ISO2. The second electrodes PN of the memory cells MC1 adjacent along the third direction D3 may be coupled to each other. The second electrodes PN of the data storage elements CAP may be coupled to a common plate PL. Common plates PL adjacent along the third direction D3 may be isolated from each other by the second isolation material ISO2.

The horizontal conductive line DWL may include a first horizontal conductive line G1 and a second horizontal conductive line G2. The first and second horizontal conductive lines G1 and G2 may each include a first work function electrode G11, a second work function electrode G12, and a third work function electrode G13. The first work function electrode G11, the second work function electrode G12, and the third work function electrode G13 may be horizontally disposed along the second direction D2. The first work function electrode G11, the second work function electrode G12, and the third work function electrode G13 may be in parallel with one another while directly contacting one another. The second work function electrode G12 may be adjacent to the vertical conductive line BL, and the third work function electrode G13 may be adjacent to the data storage element CAP. The horizontal layer HL may have a thickness smaller than those of the first to third work function electrodes G11 to G13. The first work function electrode G11, the second work function electrode G12, and the third work function electrode G13 may be referred to as a first gate, a second gate, and a third gate, respectively.

The first work function electrode G11, the second work function electrode G12, and the third work function electrode G13 are made of materials having different work functions. The first work function electrode G11 may have a higher work function than the second and third work function electrodes G12 and G13. The first work function electrode G11 may include a high work function material. The first work function electrode G11 may have a higher work function than a mid-gap work function of silicon. The second and third work function electrodes G12 and G13 may each include a low work function material. The second and third work function electrodes G12 and G13 may each have a lower work function than the mid-gap work function of silicon. In other words, the high work function material may have a work function higher than 4.5 eV, and the low work function material may have a work function lower than 4.5 eV. The first work function electrode G11 may include a metal-base material, and the second and third work function electrodes G12 and G13 may each include a semiconductor material.

The second and third work function electrodes G12 and G13 may each include N-type dopant doped polysilicon. The first work function electrode G11 may include metal, metal nitride, or a combination thereof. The first work function electrode G11 may include tungsten, titanium nitride, or a combination thereof. A barrier material may be further formed between the second and third work function electrodes G12 and G13 and the first work function electrode G11.

In the present embodiment, each of the first and second horizontal conductive lines G1 and G2 of the horizontal conductive line DWL may be horizontally disposed in the order of the second work function electrode G12, the first work function electrode G11, and the third work function electrode G13 along the second direction D2. The first work function electrode G11 may include metal, and the second work function electrode G12 and the third work function electrode G13 may each include polysilicon.

The first and second horizontal conductive lines G1 and G2 of the horizontal conductive line DWL may each have a poly Si-metal-poly Si (PMP) structure horizontally disposed along the second direction D2. In the PMP structure, the first work function electrode G11 may include a metal-base material, and the second and third work function electrodes G12 and G13 may each include N-type dopant doped polysilicon. The N-type dopant may include phosphorus or arsenic.

A first barrier layer G12L may be disposed between the first work function electrode G11 and the second work function electrode G12. A second barrier layer G13L may be disposed between the first work function electrode G11 and the third work function electrode G13. The first and second barrier layers G12L and G13L may each include titanium nitride, tantalum nitride, tungsten nitride, or molybdenum nitride.

A plurality of first barrier layers G12L may be disposed on one side of the first work function electrode G11 along the third direction D3, and may be discontinuous by the first isolation layer ISOA along the third direction D3. A plurality of second work function electrodes G12 may be disposed along the third direction D3, and may be discontinuous by the first isolation layer ISOA along the third direction D3.

One continuous second barrier layer G13L may be disposed on the other side of the first work function electrode G11 along the third direction D3, and may be continuous along the third direction D3 while covering one side of the second isolation layer ISOB. A plurality of third work function electrodes G13 may be disposed along the third direction D3, and may be discontinuous along the third direction D3 by the second isolation layer ISOB.

The first work function electrode G11 may have a larger volume than the second and third work function electrodes G12 and G13, and thus the horizontal conductive line DWL may have a low resistance. The first work function electrodes G11 of the first and second horizontal conductive lines G1 and G2 may vertically overlap along the first direction D1 with the horizontal layer HL interposed therebetween. The second and third work function electrodes G12 and G13 of the first and second horizontal conductive lines G1 and G2 vertically overlap along the first direction D1 with the horizontal layer HL interposed therebetween. An overlapping area between the first work function electrode G11 and the horizontal layer HL may be greater than an overlapping area between the second and third work function electrodes G12 and G13 and the horizontal layer HL. The second and third work function electrodes G12 and G13 and the first work function electrode G11 may extend along the third direction D3.

As described above, the first and second horizontal conductive lines G1 and G2 may each have a triple work function electrode structure including the first to third work function electrodes G11 to G13. The horizontal conductive line DWL may include a pair of first work function electrodes G11, a pair of second work function electrodes G12, and a pair of third work function electrodes G13 across the horizontal layer HL with the horizontal layer HL interposed therebetween and extend along the third direction D3. The first work function electrodes G11 of the horizontal conductive line DWL may vertically overlap the channel CH, the second work function electrodes G12 of the horizontal conductive line DWL may vertically overlap the channel CH, and the third work function electrodes G13 of the horizontal conductive line DWL may vertically overlap the channel CH. The first and second doped regions SR and DR may not overlap the first to third work function electrodes G11 to G13. A part of the channel CH between the second work function electrodes G12 and the first doped region SR is referred to herein as a first underlap region UL1. A part of the channel CH between the third work function electrodes G13 and the second doped region DR is referred to herein as a second underlap region UL2. The first underlap region UL1 and the second underlap region UL2 are shown in FIG. 3C.

The first work function electrode G11 having a high work function may be disposed at the center of the horizontal conductive line DWL, and the second and third work function electrodes G12 and G13 each having a low work function may be disposed at both ends of the horizontal conductive line DWL, which makes it possible according to one aspect of the present disclosure to reduce leakage current such as gate induced drain leakage (GIDL).

As the first work function electrode G11 having a high work function is disposed at the center of the horizontal conductive line DWL, a threshold voltage of the switching element TR may be increased. Since the second work function electrode G12 of the horizontal conductive line DWL has a low work function, a low electric field may be formed between the vertical conductive line BL and the horizontal conductive line DWL. Since the third work function electrode G13 of the horizontal conductive line DWL has a low work function, a low electric field may be formed between the data storage element CAP and the horizontal conductive line DWL.

As described above, the memory cell MC1 may include the horizontal conductive line DWL having a triple work function electrode structure. The first and second horizontal conductive lines G1 and G2 of the horizontal conductive line DWL may each include the first work function electrode G11, the second work function electrode G12, and the third work function electrode G13. The first work function electrode G11 may overlap the channel CH, the second work function electrode G12 may be adjacent to or in proximity to the vertical conductive line BL and the first doped region SR, and the third work function electrode G13 may be adjacent to or in proximity to the data storage element CAP and the second doped region DR. Due to the low work function of the second work function electrode G12, a low electric field may be formed between the horizontal conductive line DWL and the vertical conductive line BL, thereby making it possible according to another aspect of the present disclosure to reduce leakage current between the conductive line DWL and the vertical conductive line BL. Due to the low work function of the third work function electrode G13, a low electric field may be formed between the horizontal conductive line DWL and the data storage element CAP, thereby making it possible according to still another aspect of the present disclosure to reduce leakage current between the conductive line DWL and the data storage element CAP. Due to the high work function of the first work function electrode G11, a high threshold voltage of the switching element TR may be formed, and the height of the memory cell MC1 may be lowered due to the formation of a low electric field, which is advantageous in terms of integration density improvement.

As Comparative Example 1, when the first and second horizontal conductive lines G1 and G2 are each made of only a metal-base material, a high electric field is formed between the first and second horizontal conductive lines G1 and G2 and the data storage element CAP due to a high work function of the metal-base material, which increases the leakage current of the memory cell MC1. The increase in the leakage current due to such a high electric field intensifies as the channel CH becomes thinner.

As Comparative Example 2, when the first and second horizontal conductive lines G1 and G2 are each made of only a low work function material, the threshold voltage of the switching element TR decreases due to the low work function, resulting in leakage current.

In the embodiment shown in FIGS. 3A-3C, since the first and second horizontal conductive lines G1 and G2 of the horizontal conductive line DWL each have a triple work function electrode structure, leakage current may be reduced, and thus the refresh characteristics of the memory cell MC1 may be secured, which makes it possible to achieve according to one aspect of the present disclosure low power consumption.

In the embodiment shown in FIGS. 3A-3C, since the first and second horizontal conductive lines G1 and G2 of the horizontal conductive line DWL each have a triple work function electrode structure, it is relatively advantageous to increase an electric field even though the thickness of the channel CH decreases for high integration, thereby making it possible to implement an increase in stacking stages.

FIG. 4 to FIG. 25 are views for explaining an example of a method for fabricating a semiconductor device in accordance to various embodiments.

Figure 4:
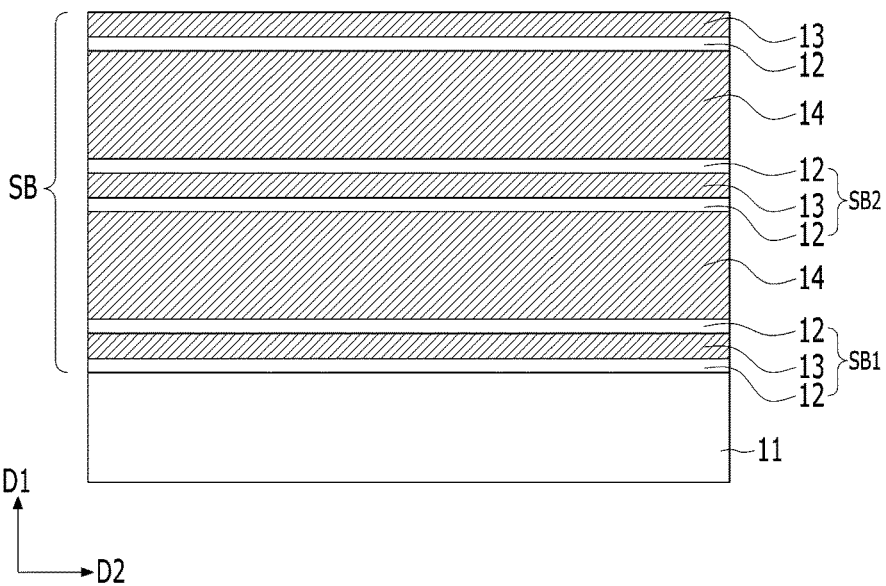
FIG. 4 to FIG. 25 are views for explaining an example of a method for fabricating a semiconductor device in accordance with still another embodiment.

As illustrated in FIG. 4, a stack body SB may be formed above a lower structure 11. In the stack body SB, a plurality of sub-stacks may be alternately stacked. The individual sub-stack may be stacked in the order of a sacrificial layer 12, a sacrificial semiconductor layer 13, the sacrificial layer 12, and a semiconductor layer 14. The sacrificial layers 12 may each include silicon germanium, and the sacrificial semiconductor layers 13 may each include single crystal silicon. The semiconductor layer 14 may include single crystal silicon. The sacrificial layer 12, the sacrificial semiconductor layer 13, the sacrificial layer 12, and the semiconductor layer 14 may be formed by epitaxial growth. The sacrificial layer 12 may be thinner than the sacrificial semiconductor layer 13, and the semiconductor layer 14 may be thicker than the sacrificial semiconductor layer 13.

The stack body SB may include a first sacrificial layer structure SB1, the semiconductor layer 14, and a second sacrificial layer structure SB2. The first sacrificial layer structure SB1 may be disposed below the semiconductor layer 14, and the second sacrificial layer structure SB2 may be disposed above the semiconductor layer 14. The first and second sacrificial layer structures SB1 and SB2 may each be a triple layer stack of the sacrificial layer 12, the sacrificial semiconductor layer 13, and the sacrificial layer 12. For example, when the sacrificial layer 12 includes a silicon germanium layer and the sacrificial semiconductor layer 13 includes a single crystal silicon layer, the triple layer stack of each of the first and second sacrificial layer structures SB1 and SB2 may include a first silicon germanium layer/single crystal silicon layer/second silicon germanium layer (SiGe/Si/SiGe) stack.

The sacrificial semiconductor layer 13 may include a first single-crystal silicon layer, and the semiconductor layer 14 may include a second single-crystal silicon layer. Accordingly, in the stack body SB, the first sacrificial layer structure SB1 may be disposed below the second single crystal silicon layer, and the second sacrificial layer structure SB2 may be disposed above the second single crystal silicon layer. The first and second sacrificial layer structures SB1 and SB2 may each include a first silicon germanium layer/first single crystal silicon layer/second silicon germanium layer stack. The second single-crystal silicon layer may be thicker than the first single-crystal silicon layer.

As referred to in the embodiments described herein, when memory cells are stacked, the stack body SB may be stacked several times.

Figure 5:
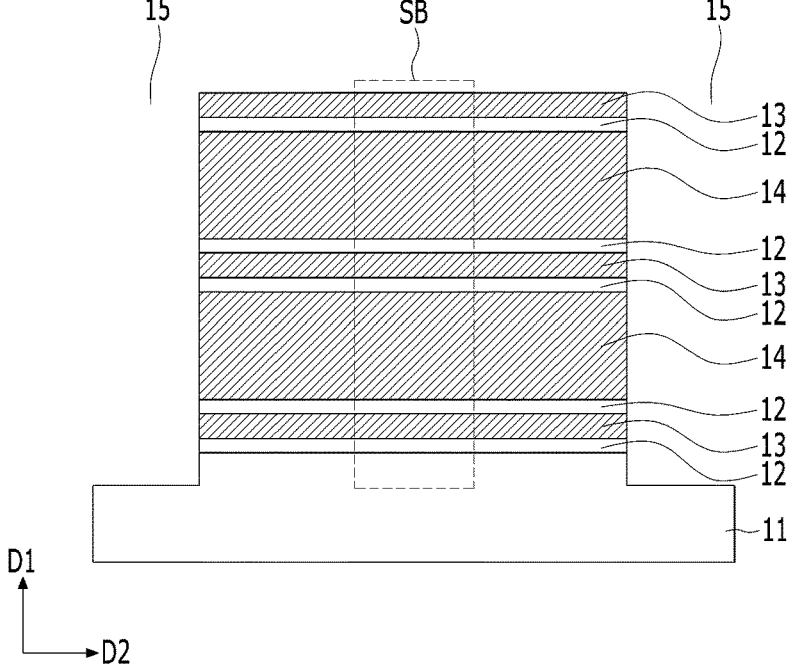

As illustrated in FIG. 5, a first opening 15 may be formed by etching a part of the stack body SB. The first opening 15 may extend vertically from the surface of the lower structure 11. Before the first opening 15 is formed, the stack body SB may be patterned in units of memory cells.

Figure 6:
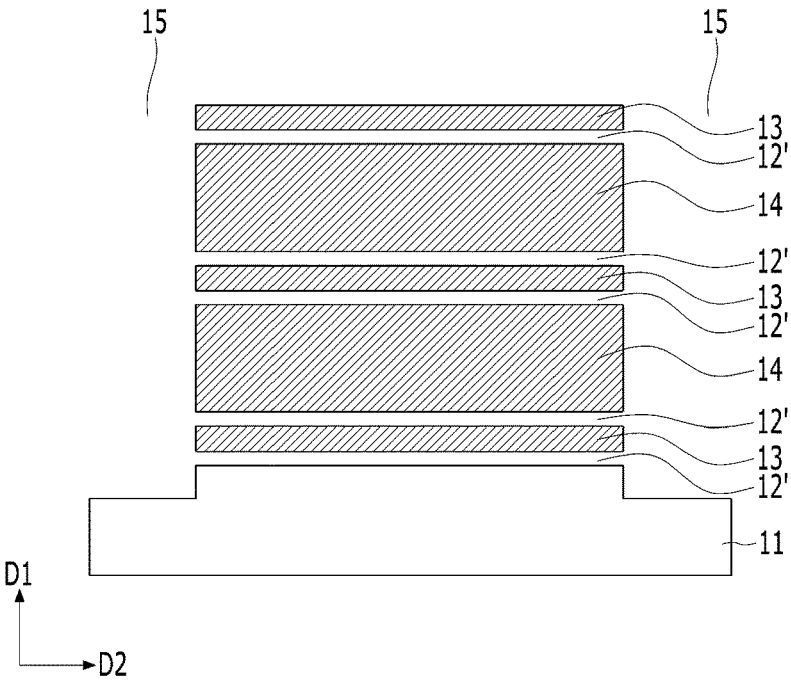

As illustrated in FIG. 6, a plurality of initial horizontal recesses 12' may be formed between the sacrificial semiconductor layers 13 and the semiconductor layers 14. In order to form the plurality of initial horizontal recesses 12', the sacrificial layers 12 may be selectively removed through the first openings 15. The initial horizontal recesses 12' may have substantially the same size, for example, substantially the same height.

In order to selectively remove the sacrificial layers 12, a difference in etching selectivity between the sacrificial semiconductor layers 13/the semiconductor layers 14 and the sacrificial layers 12 may be used. The sacrificial layers 12 may be removed using wet etching or dry etching. For example, when the sacrificial layers 12 each include a silicon germanium layer and the sacrificial semiconductor layers 13 and the semiconductor layers 13 and the semiconductor layers 14 each include a silicon layer, the silicon germanium layers may be etched using an etchant or an etchant gas having a selectivity with respect to the silicon layers.

Figure 7:
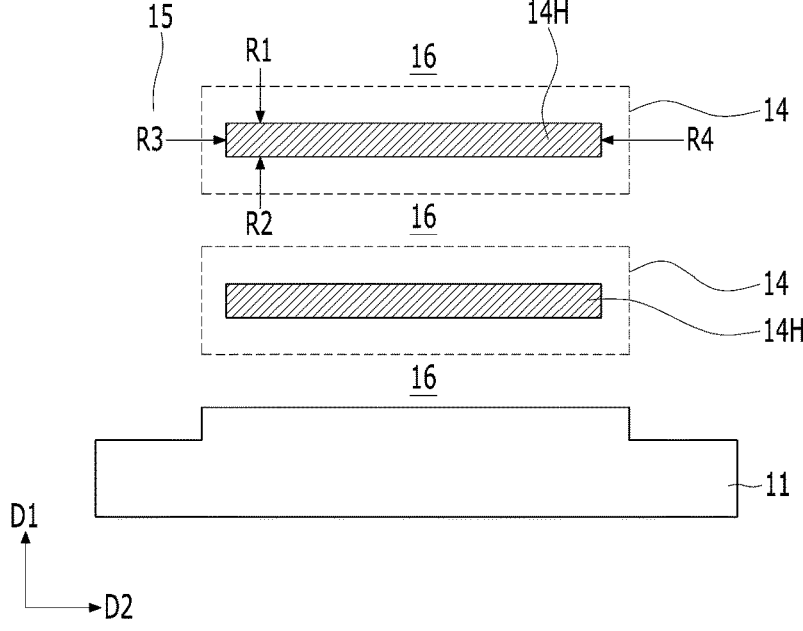

As illustrated in FIG. 7, the sacrificial semiconductor layers 13 and the semiconductor layers 14 are recessed through the first openings 15 and the initial horizontal recesses 12' (see reference numeral R1 to R4). In order to recess the sacrificial semiconductor layers 13 and the semiconductor layers 14, wet etching or dry etching may be used. In the embodiment of FIG. 7, the semiconductor layers 14 may be partially etched until the sacrificial semiconductor layers 13 are all removed. Accordingly, the thin sacrificial semiconductor layers 13 may all be removed, and the thick semiconductor layers 14 may be thinned as indicated by reference numeral '14H'. A recess process for forming the thinned semiconductor layer 14H, that is, the semiconductor layer patterns 14H may be referred to as a thinning process of the semiconductor layers 14. The semiconductor layer patterns 14H may be referred to herein as a thin-body active layer. The semiconductor layer patterns 14H may each include a single crystal silicon layer. While the semiconductor layer patterns 14H are formed, the surface of the lower structure 11 may also be recessed to a predetermined depth, as shown in FIG. 7.

Through the recess process described above, the semiconductor layer patterns 14H and horizontal recesses 16 may be formed. Upper surfaces and lower surfaces of the semiconductor layer patterns 14H may each include a flat surface.

Figure 8:
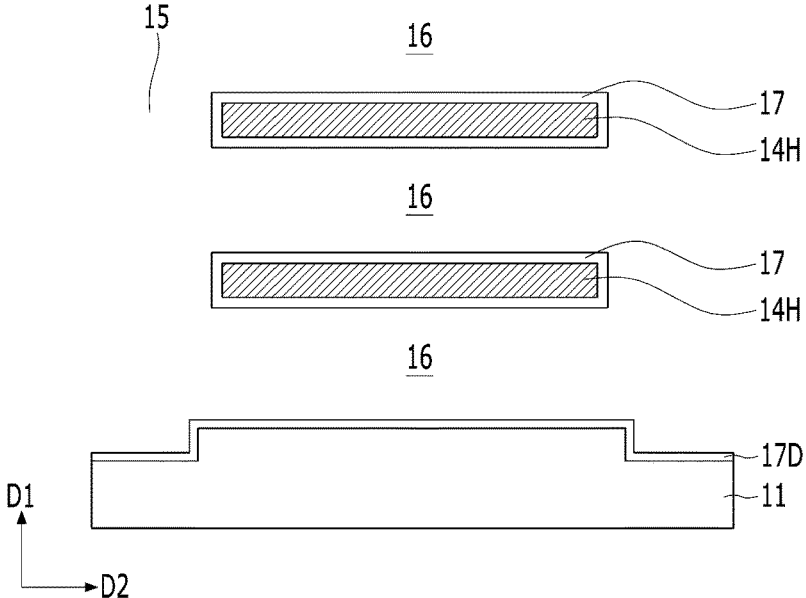

As illustrated in FIG. 8, a gate dielectric layer 17 may be formed to fully cover the semiconductor layer patterns 14H. The gate dielectric layer 17 may be formed by a deposition process or an oxidation process. The gate dielectric layer 17 may include for example silicon oxide, silicon nitride, metal oxide, metal oxynitride, metal silicate, high-k material, ferroelectric material, anti-ferroelectric material, or a combination thereof. The gate dielectric layer 17 may include for example $SiO_2$, $Si_3N_4$, $HfO_2$, $Al_2O_3$, $ZrO_2$, AlON, HfON, HfSiO, HfSiON, or a combination thereof. The gate dielectric layer 17 may be formed by a silicon oxide deposition process. The gate dielectric layer 17 may be formed by a surface oxidation process of the semiconductor layer patterns 14H.

In the embodiment shown in FIG. 8, the gate dielectric layer 17 may be formed by an oxidation process, and thus the gate dielectric layer 17 may be formed with a uniform thickness on all the surfaces of the semiconductor layer patterns 14H.

While the gate dielectric layer 17 is formed, a first buffer layer 17D may be formed on the surface of the lower structure 11. The gate dielectric layer 17 and the first buffer layer 17D may be substantially the same material.

Figure 9:
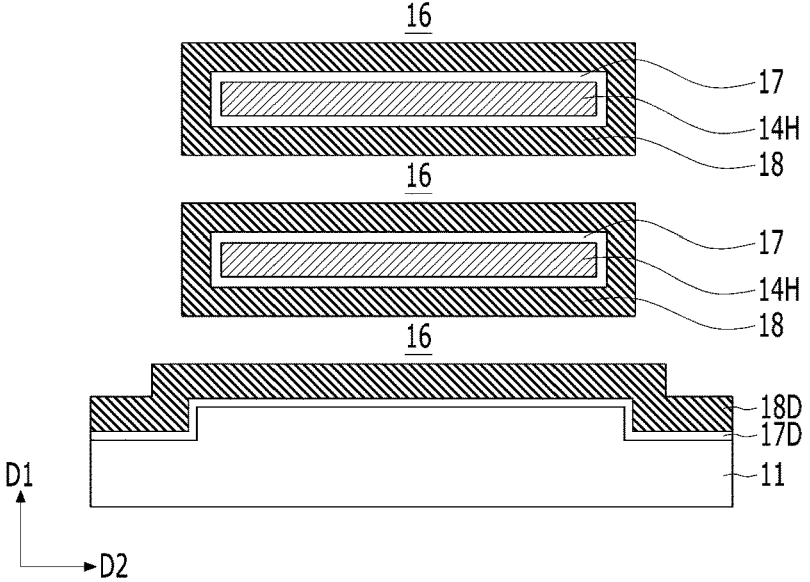

As illustrated in FIG. 9, a conductive layer 18 may be formed on the gate dielectric layers 17. The conductive layer 18 may include for example polysilicon, metal, metal nitride, metal carbide, or a combination thereof. The conductive layer 18 may include for example tungsten, titanium nitride, doped polysilicon, or a combination thereof. The conductive layer 18 may include a metal-base layer. In the conductive layer 18, materials having different work functions may be sequentially deposited.

The conductive layer 18 may surround the semiconductor layer patterns 14H on the gate dielectric layer 17. The conductive layer 18 may include a first edge portion E11 and a second edge portion E12 facing each other horizontally (to be discussed in more detail later).

While the conductive layer 18 is formed, a dummy conductive layer 18D may be formed on the first buffer layer 17D. The conductive layer 18 and the dummy conductive layer 18D may be substantially the same material.

Figure 10:
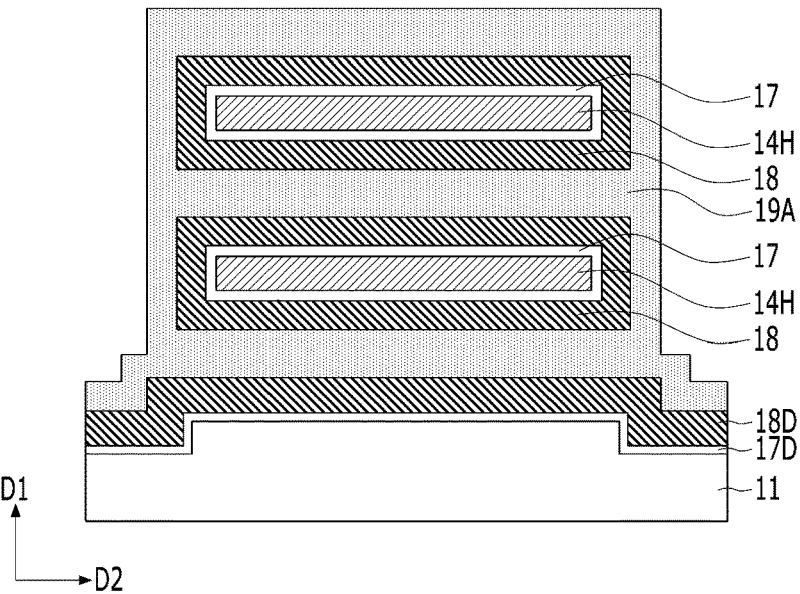

As illustrated in FIG. 10, an insulating layer 19A may be formed on the conductive layer 18. The insulating layer 19A may be filled between the conductive layers 18 vertically adjacent to each other. The insulating layer 19A may include silicon oxide.

Figure 11:
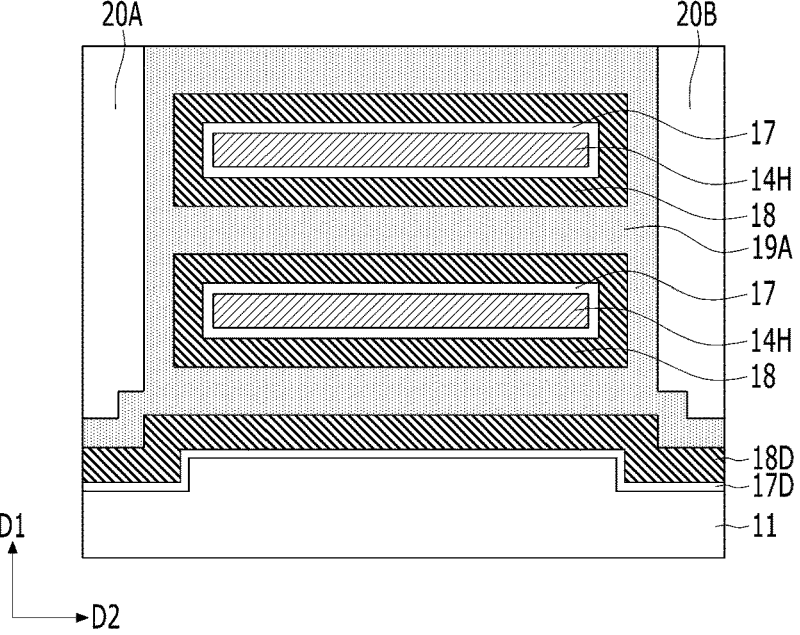

As illustrated in FIG. 11, sacrificial isolation layers 20A and 20B may be formed to fill the first openings 15. The sacrificial isolation layers 20A and 20B may each include an insulating material, a conductive material, or a combination thereof. The sacrificial isolation layers 20A and 20B may each include for example silicon oxide, silicon nitride, titanium nitride, amorphous carbon, or a combination thereof. The sacrificial isolation layers 20A and 20B are referred to herein as a first sacrificial isolation layer 20A and a second sacrificial isolation layer 20B.

Figure 12:
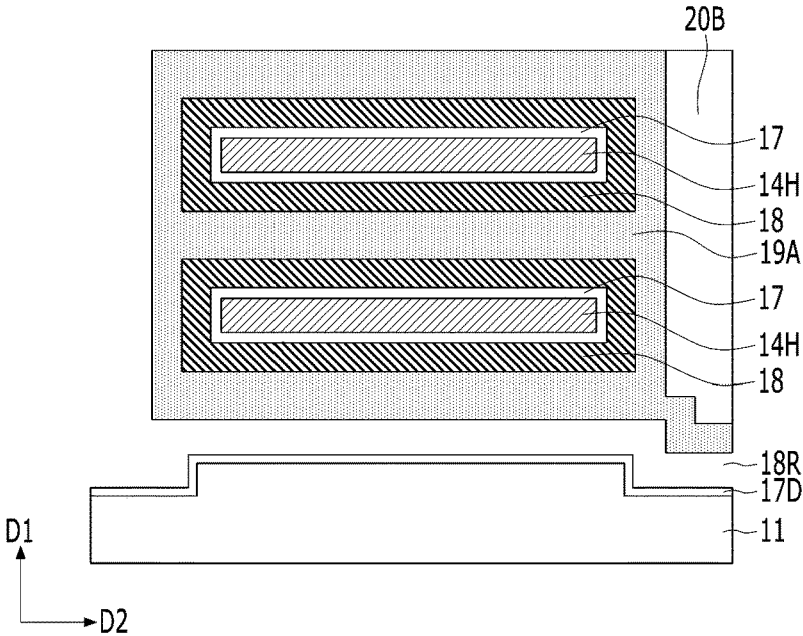

As illustrated in FIG. 12, one of the sacrificial isolation layers 20A and 20B, that is as illustrated, the first sacrificial isolation layer 20A may be selectively removed. Subsequently, a lower level gap 18R may be formed by removing the dummy conductive layer 18D. While the dummy conductive layer 18D is removed, the first buffer layer 17D and the insulating layer 19A may each serve as an etch barrier.

Figure 13:
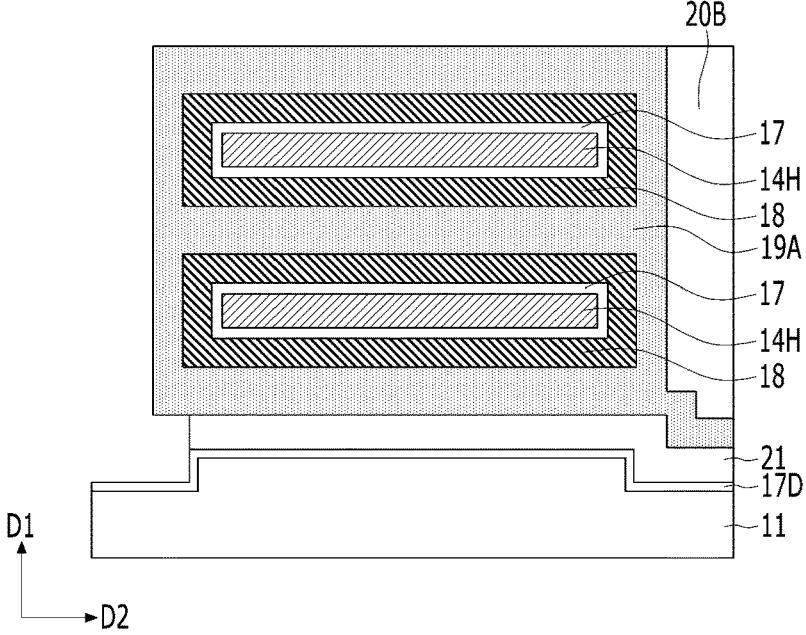

As illustrated in FIG. 13, a second buffer layer 21 may be formed to fill the lower level gap 18R. The second buffer layer 21 may include silicon oxide. The step of forming the second buffer layer 21 may include a step of depositing silicon oxide filling the lower level gap 18R and a step of etching the silicon oxide.

Figure 14:
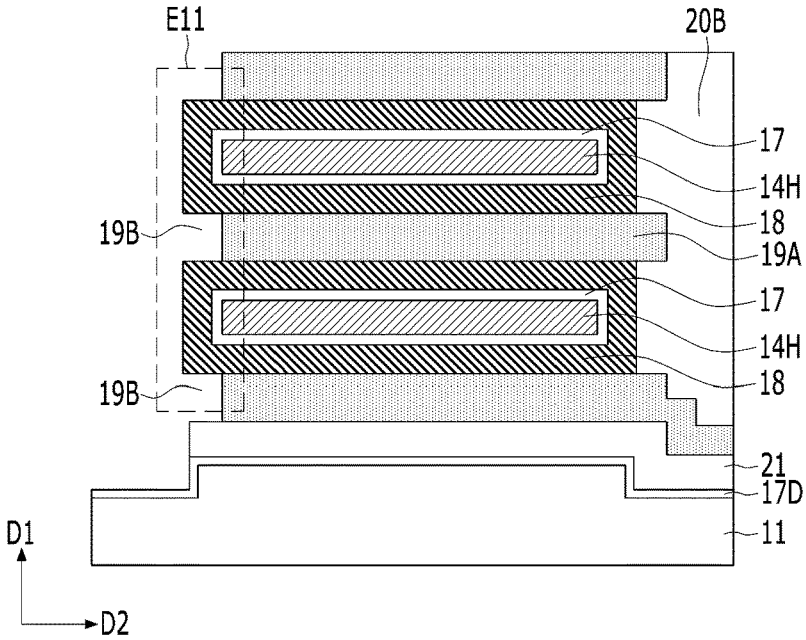

As illustrated in FIG. 14, the insulating layer 19A may be selectively cut in order to form side portions 19B. Accordingly, the first edge portions E11 of the conductive layer 18 may be exposed by the side portions 19B.

Figure 15:
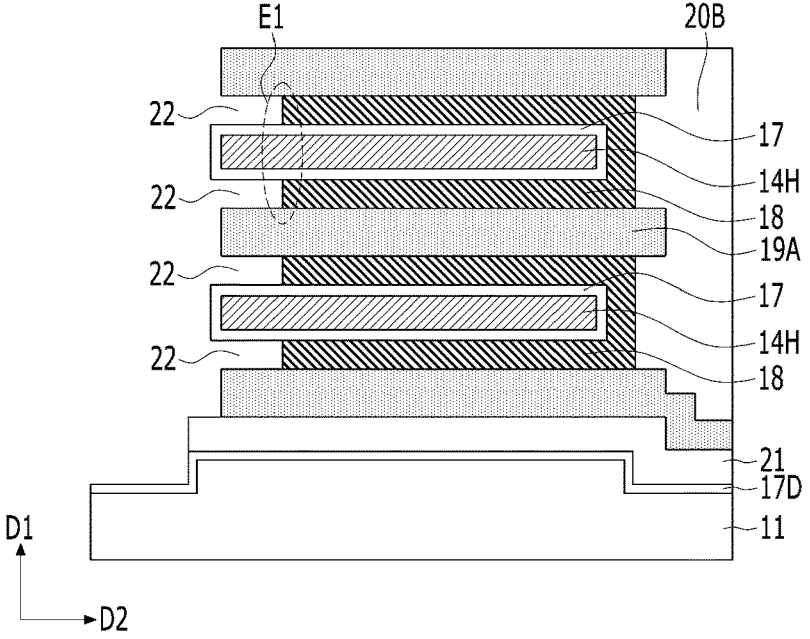

As illustrated in FIG. 15, the conductive layer 18 may be selectively recessed. Accordingly, partial recesses 22 may be formed. Parts of the gate dielectric layer 17 may be exposed by the partial recesses 22.

The recess process of the conductive layer 18 for forming the partial recesses 22 is referred to herein as a first recess process of the conductive layer 18.

Figure 16:
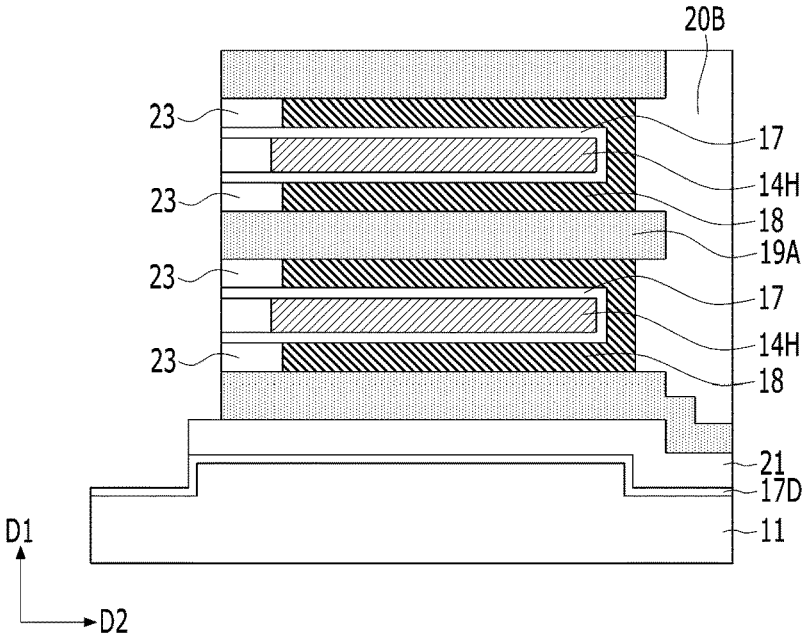

As illustrated in FIG. 16, a first capping layer 23 may be formed to fill the partial recesses 22. The first capping layer 23 may include silicon oxide, silicon nitride, or a combination thereof. Deposition and etch-back of a capping material may be performed in order to form the first capping layer 23.

Figure 17:
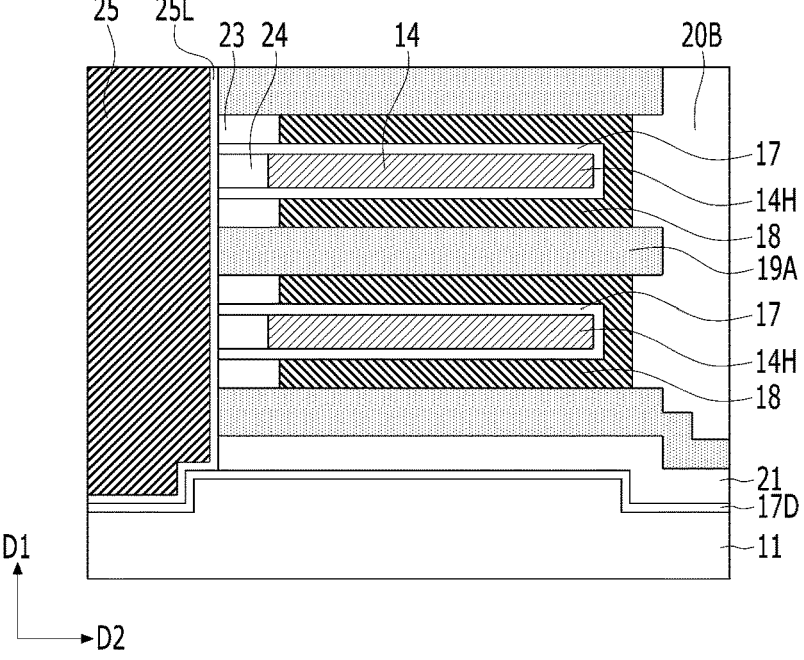

As illustrated in FIG. 17, a first doped region 24 may be formed on one side of each of the semiconductor layer patterns 14H. The step of forming the first doped region 24 may include a deposition step of polysilicon doped with N-type impurities, a heat treatment step, and a doped polysilicon removal step. The first doped region 24 may include impurities diffused from the doped polysilicon. In another embodiment, the first doped region 24 may be formed by an impurity doping process.

Subsequently, a vertical conductive line 25 may be formed. The vertical conductive line 25 may be coupled in common to the first doped regions 24. The vertical conductive line 25 may include titanium nitride, tungsten, or a combination thereof. The vertical conductive line 25 may include a bit line. Before the vertical conductive line 25 is formed, a first contact node 25L may be formed. The first contact node 25L may include doped polysilicon. The first doped region 24 may also include impurities diffused from the first contact node 25L.

In another embodiment, before the vertical conductive line 25 is formed, a first ohmic contact coupled to one ends of the semiconductor layer patterns 14H may be formed. The first ohmic contact may include metal silicide. For example, the metal silicide may be formed by sequentially performing metal layer deposition and annealing, and an unreacted metal layer may be removed. The metal silicide may be formed by a reaction between silicon of the semiconductor layer pattern 14H and the metal layer.

Figure 18:
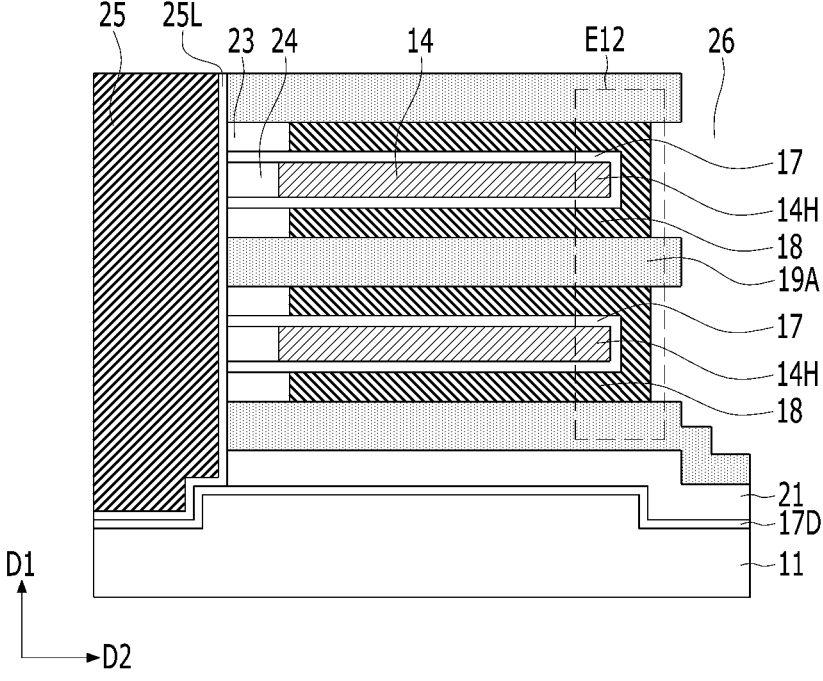

As illustrated in FIG. 18, a second opening 26 may be formed by removing the second sacrificial isolation layer 20B. The second opening 26 may extend vertically from the surface of the lower structure 11.

The second edge portion E12 of the conductive layer 18 may be exposed by the second opening 26.

Figure 19:
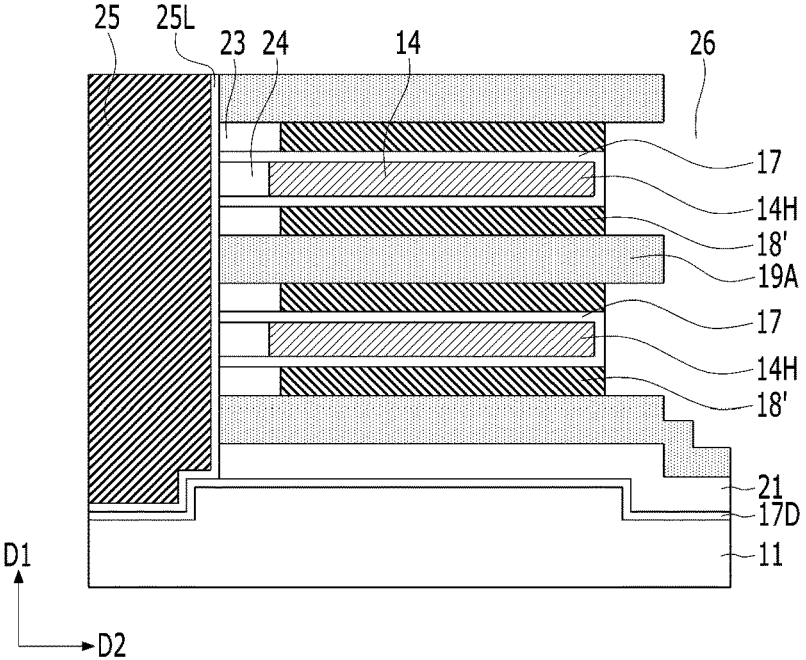

As illustrated in FIG. 19, the second edge portion E12 of the conductive layer 18 may be selectively recessed through the second opening 26. Accordingly, a pair of horizontal conductive layer patterns 18' may be formed.

The recess process of the conductive layer 18 for forming the pair of horizontal conductive layer patterns 18' is referred to herein as a second recess process of the conductive layer 18.

Figure 20:
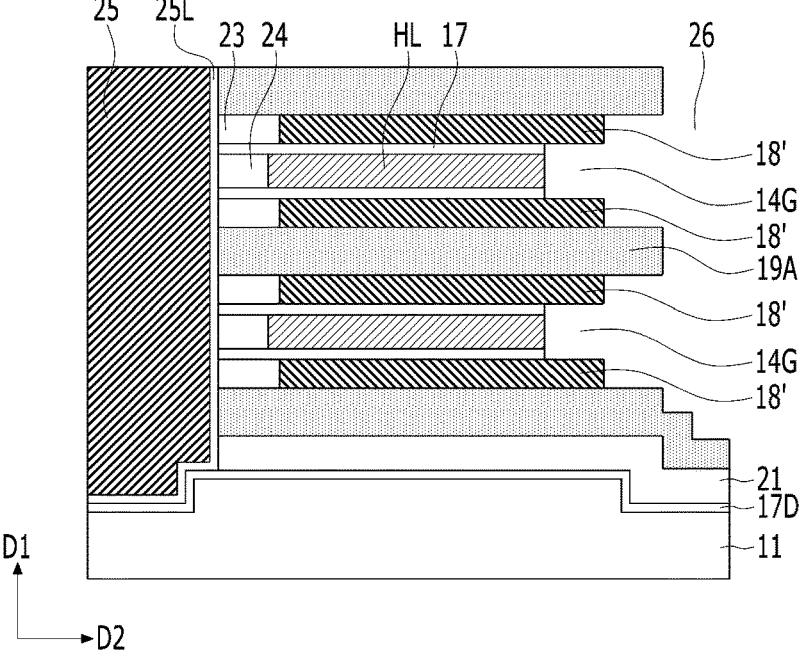

As illustrated in FIG. 20, the gate dielectric layers 17 and the semiconductor layer pattern 14H may be selectively recessed. Accordingly, side portions 14G may be formed between the horizontal conductive layer patterns 18'. The semiconductor layer pattern 14H may remain as the horizontal layer HL as indicated by reference numeral 'HL', and the other end of the horizontal layer HL may be exposed by the side portions 14G.

Figure 21:
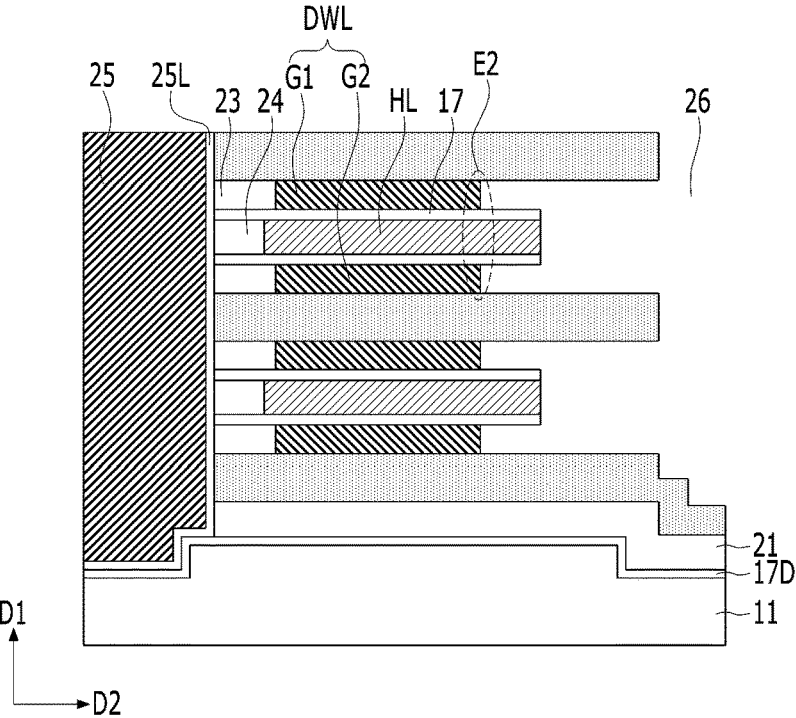

As illustrated in FIG. 21, the horizontal conductive layer patterns 18' may be additionally recessed. Accordingly, the horizontal conductive line DWL including the first horizontal conductive line G1 and the second horizontal conductive line G2 may be formed.

The recess process of the horizontal conductive layer patterns 18' for forming the horizontal conductive line DWL is referred to herein as a third recess process of the conductive layer 18.

As referred to in the series of processes described above, the step of forming the horizontal conductive line DWL may include a step of forming the gate dielectric layer 17 covering the surface of the semiconductor layer pattern 14H, a step of forming the conductive layer 18 surrounding the semiconductor layer pattern 14H on the gate dielectric layer 17, and a step of performing the first recess process, the second recess process, and the third recess process on the conductive layer 18. The first edge portion (see 'E1' in FIG. 15) of the horizontal conductive line DWL may be defined by the first recess process, and the second edge portion ('E2' in FIG. 21) of the horizontal conductive line DWL may be defined by the second and third recess processes.

Since the first recess process, the second recess process, and the third recess process are used in order to form the horizontal conductive line DWL, it is possible to improve the gate oxide integrity (GOI) characteristics of the gate dielectric layer 17, and to uniformly maintain the thickness of the gate dielectric layer 17.

Since the first recess process, the second recess process, and the third recess process are used in order to form the horizontal conductive line DWL, it is possible to reduce the recess amount of sides of the conductive layer 18. Accordingly, it is possible to uniformly maintain the length of the horizontal conductive lines DWL in the lateral direction.

The first horizontal conductive line G1 and the second horizontal conductive line G2 may correspond to the first work function electrode G11 or the first gate as referred to in FIG. 3A to FIG. 3C.

Figure 22:
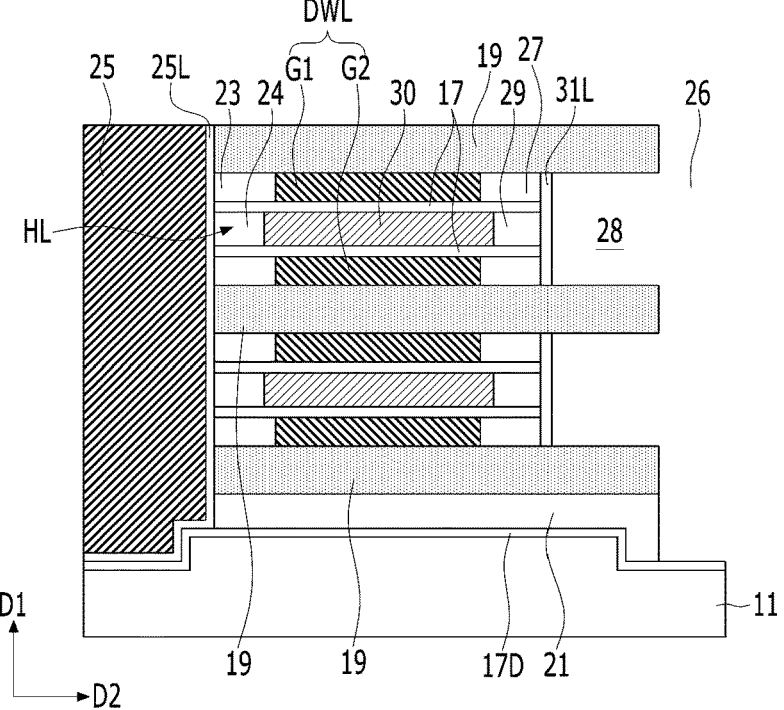

As illustrated in FIG. 22, second capping layers 27 contacting the first horizontal conductive line G1 and the second horizontal conductive line G2 may be formed. The second capping layer 27 may include silicon oxide, silicon nitride, or a combination thereof. Deposition and etch-back of a capping material may be performed in order to form the second capping layer 27.

After the second capping layer 27 is formed, wide openings 28 may be formed. The other end of the horizontal layer HL may be exposed by the wide opening 28.

The wide openings 28 may be disposed between the insulating layers 19.

A second contact node 31L may be formed. The second contact node 31L may include doped polysilicon.

Subsequently, a second doped region 29 may be formed in the horizontal layer HL. The step of forming the second doped region 29 may include a deposition step of polysilicon doped with N-type impurities, a heat treatment step, and a doped polysilicon removal step. The second doped region 29 may include impurities diffused from the doped polysilicon. In another embodiment, the doped polysilicon may remain after the heat treatment step. In another embodiment, the second doped region 29 may be formed by a doping process of impurities. The second doped region 29 may also include impurities diffused from the second contact node 31L.

In another embodiment, a second ohmic contact coupled to the second doped region 29 of the horizontal layer HL may be formed. The second ohmic contact may include metal silicide. For example, the metal silicide may be formed by sequentially performing metal layer deposition and annealing, and an unreacted metal layer may be removed. The metal silicide may be formed by a reaction between silicon of the horizontal layer HL and the metal layer.

The semiconductor layer patterns 14H may be converted into the horizontal layers HL by the series of processes described above, and the individual horizontal layer HL may include the first doped region 24 and the second doped region 29. The individual horizontal layer HL may further include a channel 30, and the channel 30 may be defined between the first doped region 24 and the second doped region 29. The channel 30 may overlap the horizontal conductive line DWL. Parts of the channel 30 may not overlap the first and second horizontal conductive lines G1 and G2. That is, the channel 30 may include the first and second underlap regions as referred to in FIG. 3C.

Figure 23:
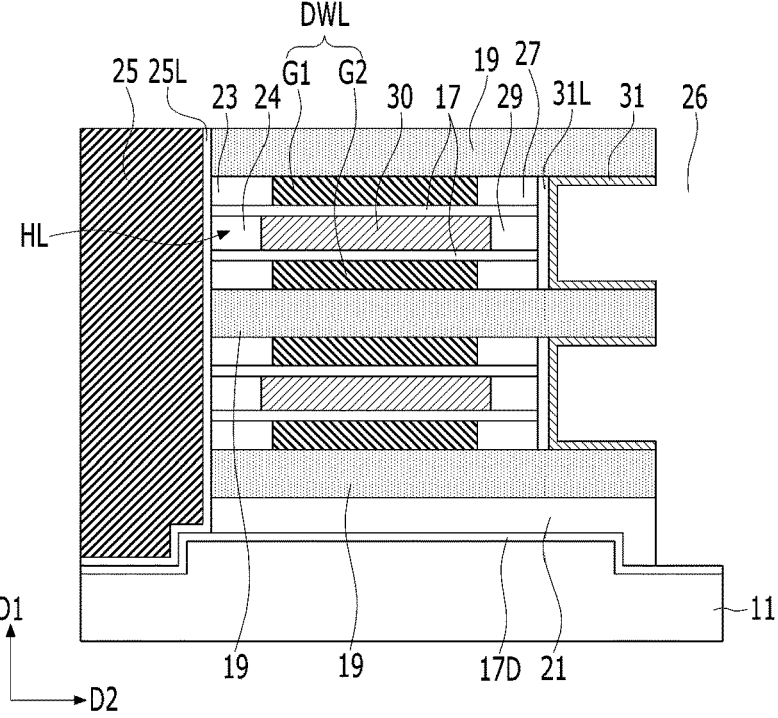

As illustrated in FIG. 23, first electrodes 31 of the data storage element respectively contacting the other ends of the horizontal layers HL may be formed. In order to form the first electrode 31, a conductive material deposition and etch-back process may be performed. The first electrode 31 may include titanium nitride. The first electrode 31 may have a horizontally oriented cylindrical shape.

Figure 24:
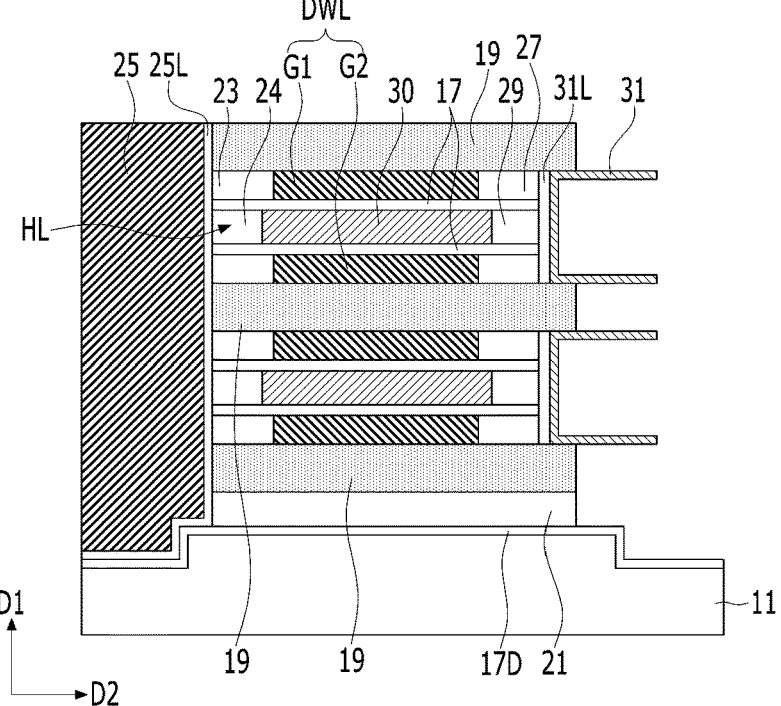

As illustrated in FIG. 24, the insulating layers 19A may be partially recessed. Accordingly, outer walls of the first electrodes 31 may be exposed. The remaining insulating layers 19 may contact the horizontal conductive line DWL. The remaining insulating layers 19 may be referred to as a cell insulating layer or a cell isolation layer.

Figure 25:
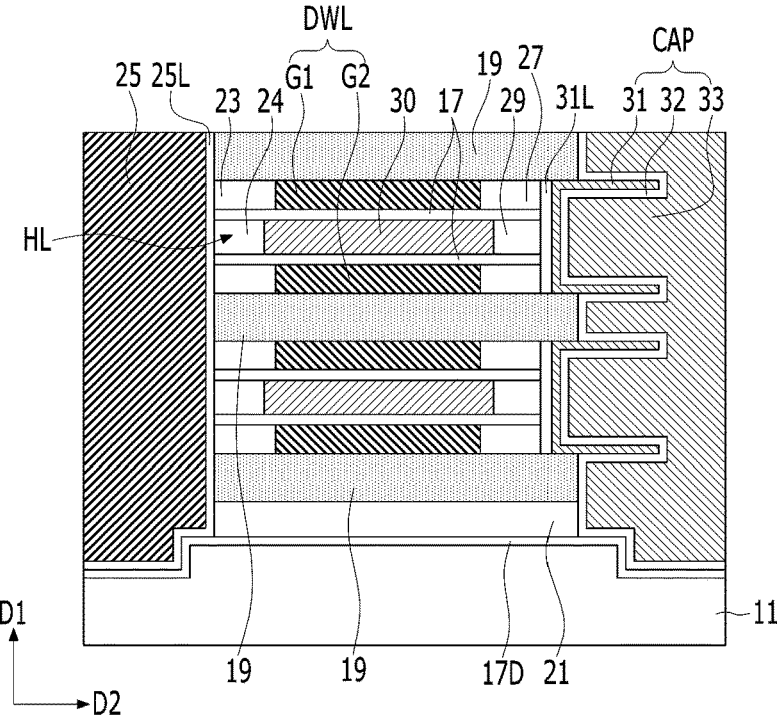

As illustrated in FIG. 25, a dielectric layer 32 and a second electrode 33 may be sequentially formed on the first electrodes 31. The first electrode 31, the dielectric layer 32, and the second electrode 33 may be a data storage element CAP.

According to FIG. 4 to FIG. 25, since the gate dielectric layer uniformly covers the surface of the semiconductor layer pattern, it is possible to improve cell GOI characteristics.

In addition, since the horizontal conductive line DWL is formed by the first to third recess processes of the conductive layer 18, the fume of the conductive layer 18 may be suppressed, which makes it possible to improve the yield for forming the horizontal conductive line DWL.

In another embodiment, the first and second horizontal conductive lines G1 and G2 of the horizontal conductive line DWL may each have a triple work function electrode structure. As referred to in FIG. 3A to FIG. 3C, the first and second horizontal conductive lines G1 and G2 each include the first work function electrode G11, the second work function electrode G12, and the third work function electrode G13. In addition, the first and second horizontal conductive lines G1 and G2 may each include the first barrier layer G12L between the first work function electrode G11 and the second work function electrode G12 and the second barrier layer G13L between the first work function electrode G11 and the third work function electrode G13.

FIG. 26 to FIG. 31 are views for explaining an example of a method for fabricating a semiconductor device in accordance with another embodiment.

Figure 26:
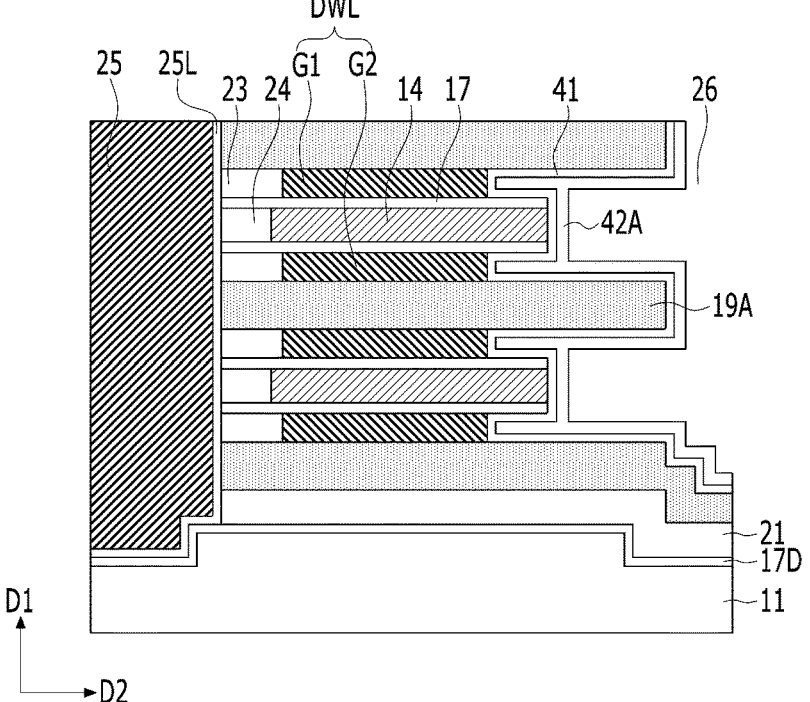
FIG. 26 to FIG. 31 are views for explaining an example of a method for fabricating a semiconductor device in accordance with another embodiment.
Figure 27:
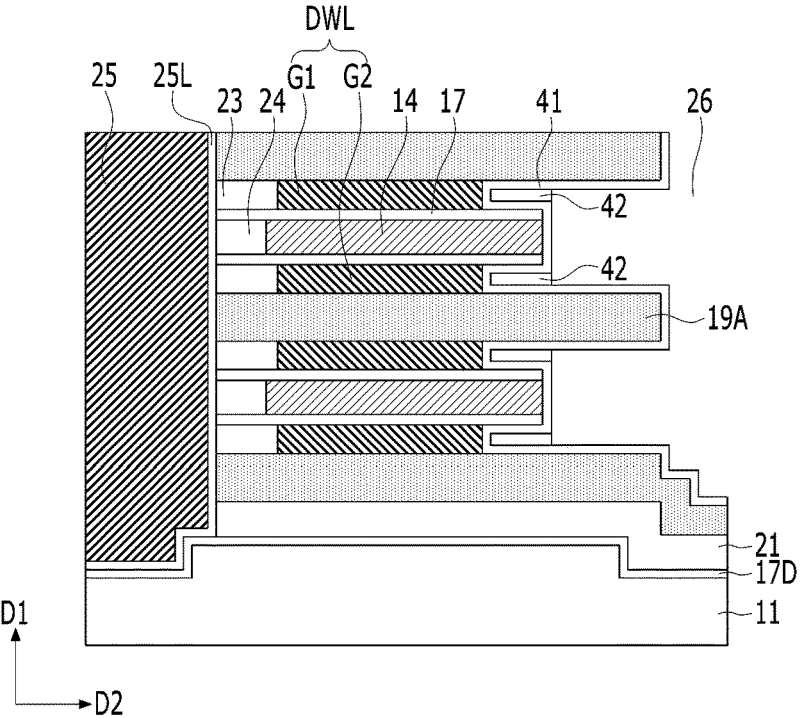

As illustrated in FIG. 26 and FIG. 27, a barrier material 41 and a sacrificial barrier 42 may be sequentially formed on a horizontal conductive line DWL. The barrier material 41 may include a metal-base material. The barrier material 41 may include metal nitride. In order to form the sacrificial barrier 42, deposition and etch-back of a sacrificial barrier material 42A may be performed. The sacrificial barrier material 42A may include polysilicon.

Figure 28:
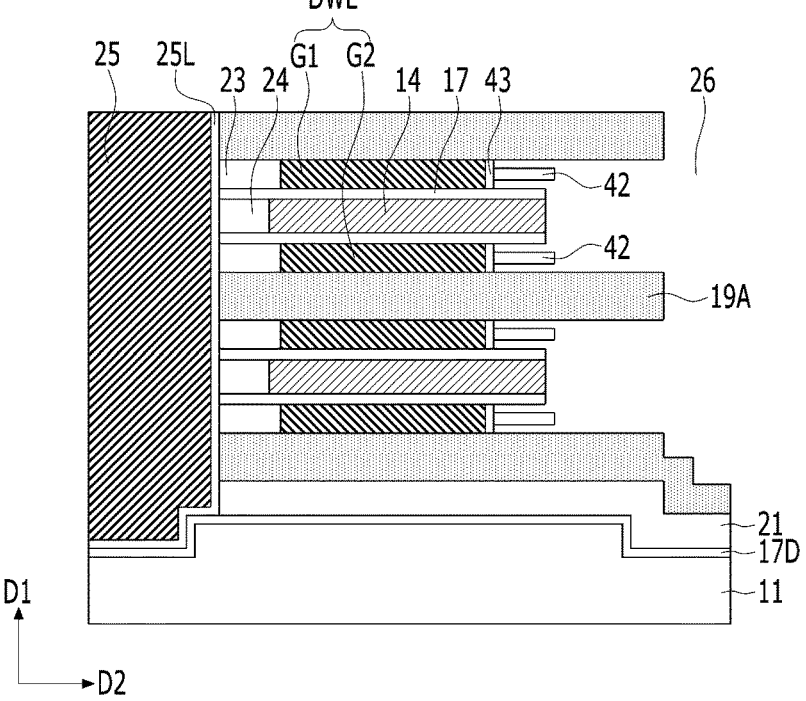

As illustrated in FIG. 28, the barrier material 41 may be selectively etched using the sacrificial barrier 42 as an etch stopper. Accordingly, a barrier layer 43 may be formed.

Figure 29:
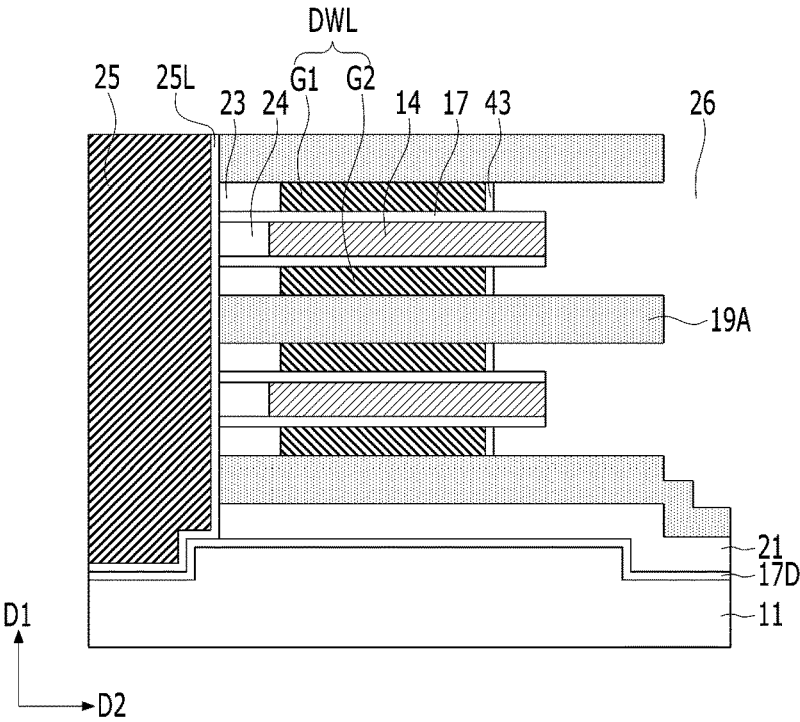

As illustrated in FIG. 29, the sacrificial barrier 42 may be removed.

Figure 30:
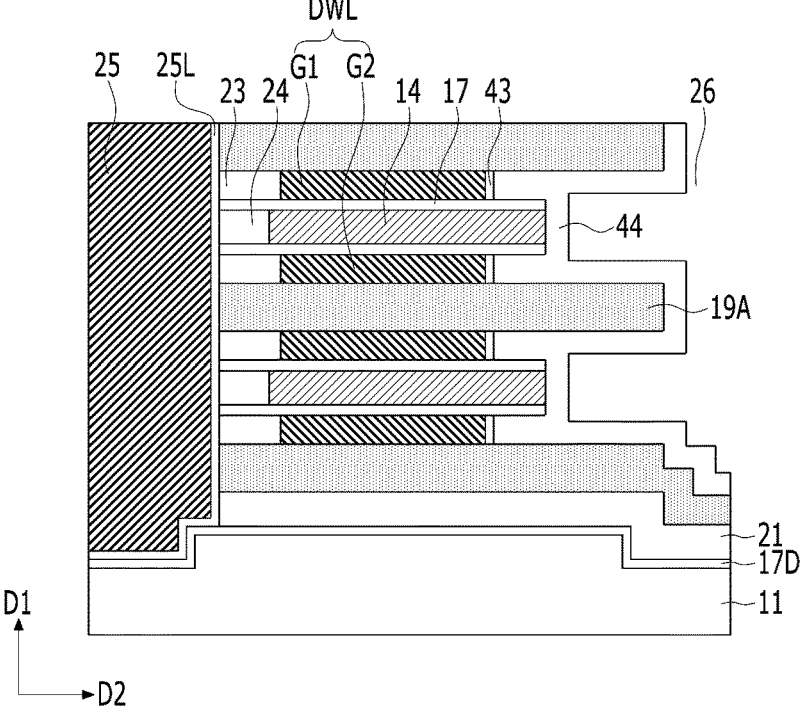
Figure 31:
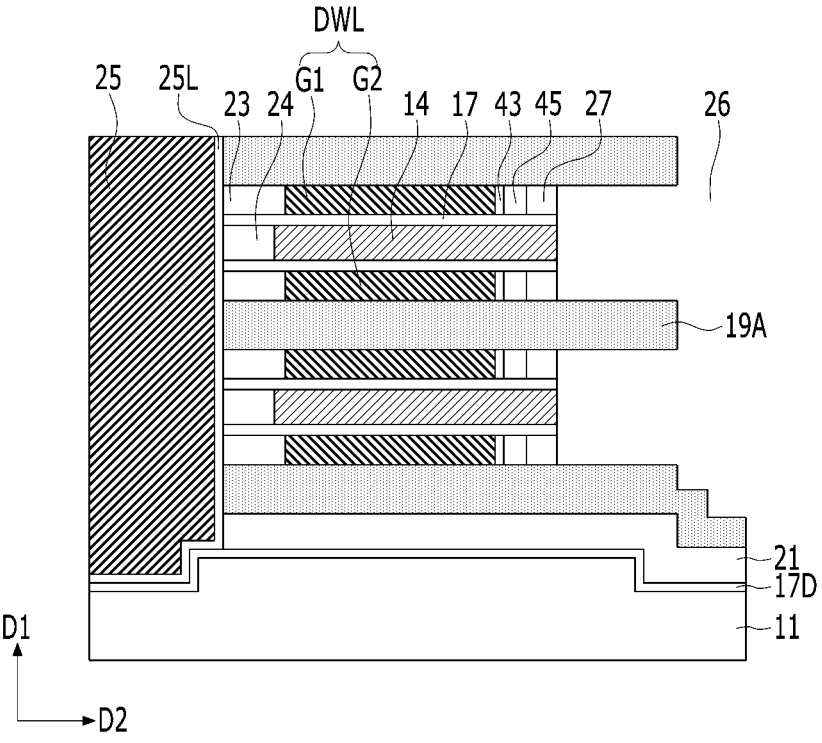

As illustrated in FIG. 30 and FIG. 31, a low work function electrode 45 contacting the barrier layer 43 may be formed. The step of forming the low work function electrode 45 includes a step of depositing a low work function material 44 on the barrier layer 43 and a step of etching the work function material 44 in order to form the low work function electrode 45. The low work function electrode 45 may include polysilicon doped with an N-type dopant.

Subsequently, a second capping layer 27 may be formed on the low work function electrode 45.

Subsequently, as referred to in FIG. 22 to FIG. 25, the second contact node 31L, the second doped region 29, the first electrode 31, the dielectric layer 32, and the second electrode 33 may be sequentially formed.

The barrier layer 43 may correspond to the second barrier layer G13L as referred to in FIG. 3A to FIG. 3C, and the low work function electrode 45 may correspond to the third work function electrode G13 or the third gate as referred to in FIG. 3A to FIG. 3C.

The first barrier layer G12L and the second work function electrode G12 referred to in FIG. 3A to FIG. 3C may be formed through the series of processes referred to in FIG. 26 to FIG. 31. For example, after the recess process of the conductive layer 18 as illustrated in FIG. 15, the barrier material deposition step, the sacrificial barrier formation step, the barrier layer formation step, the low work function material deposition step, and the low work function formation step referred to in FIG. 26 to FIG. 31 may be sequentially performed. Accordingly, a second work function electrode or a second gate may be formed on one or both sides of the first and second horizontal conductive lines G1 and G2.

By the series of processes referred to in FIG. 4 to FIG. 31, the pair of horizontal conductive lines DWL in FIG. 3A to FIG. 3C may be formed. The step of forming the pair of horizontal conductive lines DWL may include a step of forming a pair of first work function electrodes G11 respectively disposed on the upper surface and the lower surface of the semiconductor layer pattern on the gate dielectric layer, a step of forming a pair of second work function electrodes G12 on one sides of the first work function electrodes G11, and a step of forming a pair of third work function electrodes G13 on the other sides of the first work function electrodes G11, and may further include a step of forming the first barrier layer G12L between the first work function electrode G11 and the second work function electrode G12 and a step of forming the second barrier layer G13L between the first work function electrode G11 and the third work function electrode G13.

In another embodiment, the horizontal conductive line DWL may have a single structure. For example, the horizontal conductive line having the single structure may include one of the first horizontal conductive line G1 and the second horizontal conductive line G2. The horizontal conductive line having the single structure may include a triple work function electrode structure including the first work function electrode G11, the second work function electrode G12, and the third work function electrode G13.

The present disclosure described above is not limited by the aforementioned embodiments and the accompanying drawings, and those skilled in the art to which the present disclosure pertains will recognize that various replacements, modifications, and changes can be made without departing from the technical spirit of the present disclosure.

What is claimed is:

1. A method for fabricating a semiconductor device, the method comprising:
   forming a semiconductor layer pattern over a lower structure;
   forming a gate dielectric layer covering the semiconductor layer pattern;
   forming a conductive layer surrounding the semiconductor layer pattern over the gate dielectric layer;
   forming a pair of horizontal conductive layer patterns respectively disposed over an upper surface and a lower surface of the semiconductor layer pattern by selectively etching the conductive layer;
   forming a horizontal layer having a side portion between the pair of horizontal conductive layer patterns by selectively recessing the semiconductor layer pattern; and
   forming a pair of horizontal conductive lines respectively disposed over an upper surface and a lower surface of the horizontal layer by recessing the pair of horizontal conductive layer patterns.

2. The method of claim 1, wherein the forming of the semiconductor layer pattern comprises:
   sequentially forming a first sacrificial layer structure, a semiconductor layer, and a second sacrificial layer structure in order to form a stack body over the lower structure;
   forming a first opening in the stack body;
   removing the first sacrificial layer structure and the second sacrificial layer structure through the first opening; and
   recessing the semiconductor layer in order to form the semiconductor layer pattern.

3. The method of claim 2, wherein the first and second sacrificial layer structures each include a stack of a first silicon germanium layer, a first single crystal silicon layer, and a second silicon germanium layer, and
   the semiconductor layer includes a second single crystal silicon layer thicker than the first single crystal silicon layer.

4. The method of claim 1, wherein the upper surface and the lower surface of the semiconductor layer pattern each include a flat surface.

5. The method of claim 1, wherein the gate dielectric layer covers the upper surface and the lower surface of the semiconductor layer pattern.

6. The method of claim 1, wherein the gate dielectric layer is formed by a deposition process of silicon oxide or a surface oxide process of the semiconductor layer pattern.

7. The method of claim 1, further comprising:
   forming a vertical conductive line coupled to one end of the horizontal layer; and
   forming a data storage element coupled to the other end of the horizontal layer.

8. The method of claim 1, wherein the semiconductor layer pattern includes a single crystal silicon layer.

9. The method of claim 1, wherein the conductive layer includes polysilicon, metal, metal nitride, or a combination thereof.

10. The method of claim 1, wherein the forming of the conductive layer comprises:
    forming a metal-base layer surrounding the semiconductor layer pattern over the gate dielectric layer.

11. The method of claim 1, wherein the forming of the pair of horizontal conductive lines comprises:

forming a pair of first work function electrodes respectively disposed over the upper surface and the lower surface of the semiconductor layer pattern over the gate dielectric layer;

forming a pair of second work function electrodes over one side of the first work function electrodes; and forming a pair of third work function electrodes over the other sides of the first work function electrodes.

12. The method of claim 11, wherein the second and third work function electrodes each include a low work function material, and the first work function electrode includes a high work function material.

13. The method of claim 11, wherein the second and third work function electrodes each include N-doped polysilicon, and the first work function electrode includes tungsten.

14. The method of claim 11, further comprising:

forming a first barrier layer between the first work function electrode and the second work function electrode; and forming a second barrier layer between the first work function electrode and the third work function electrode.

15. The method of claim 14, wherein the first and second barrier layers each include metal nitride.

* * * * *